(12) United States Patent
Sawada et al.

(10) Patent No.: US 9,627,583 B2
(45) Date of Patent: Apr. 18, 2017

(54) LIGHT-EMITTING DEVICE AND METHOD FOR MANUFACTURING THE SAME

(71) Applicant: Panasonic Corporation, Osaka (JP)

(72) Inventors: Susumu Sawada, Osaka (JP); Seiichi Nakatani, Osaka (JP); Koji Kawakita, Nara (JP); Yoshihisa Yamashita, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/377,965

(22) PCT Filed: Jan. 28, 2013

(86) PCT No.: PCT/JP2013/000432
§ 371 (c)(1),
(2) Date: Aug. 11, 2014

(87) PCT Pub. No.: WO2013/121708
PCT Pub. Date: Aug. 22, 2013

(65) Prior Publication Data
US 2015/0008467 A1    Jan. 8, 2015

(30) Foreign Application Priority Data

Feb. 15, 2012  (JP) .................................. 2012-030739

(51) Int. Cl.
*H01L 33/48* (2010.01)
*H01L 33/62* (2010.01)
(Continued)

(52) U.S. Cl.
CPC .............. *H01L 33/38* (2013.01); *H01L 24/17* (2013.01); *H01L 33/486* (2013.01);
(Continued)

(58) Field of Classification Search
CPC ..... H01L 2933/0016; H01L 2933/0066; H01L 2933/0033;
(Continued)

(56) References Cited

U.S. PATENT DOCUMENTS

2006/0043407 A1    3/2006  Okazaki
2006/0049335 A1    3/2006  Suehiro et al.
(Continued)

FOREIGN PATENT DOCUMENTS

EP    2 197 051      6/2010
EP    2 383 808      11/2011
(Continued)

OTHER PUBLICATIONS

International Preliminary Report on Patentability and Written Opinion of the International Searching Authority issued Aug. 28, 2014 in International (PCT) Application No. PCT/JP2013/000432.
(Continued)

*Primary Examiner* — Marvin Payen
*Assistant Examiner* — Jeremy Joy
(74) *Attorney, Agent, or Firm* — Wenderoth, Lind & Ponack, L.L.P.

(57) ABSTRACT

There is provided a light-emitting device comprising a light-emitting element. The light-emitting device of the present invention comprises an electrode part for the light-emitting element; a reflective layer provided on the electrode part; and the light-emitting element provided on the reflective layer such that the light-emitting element is in contact with at least a part of the reflective layer, wherein the light-emitting element and the electrode part are in an electrical connection with each other by mutual surface contact via the at least a part of the reflective layer, wherein the electrode part serves as a supporting layer for supporting the light-emitting element, and wherein the electrode part
(Continued)

extends toward the outside of the light-emitting element and beyond the light-emitting element.

14 Claims, 22 Drawing Sheets

(51) Int. Cl.
    H01L 33/60    (2010.01)
    H01L 33/38    (2010.01)
    H01L 23/00    (2006.01)
    H01L 33/50    (2010.01)
    H01L 33/64    (2010.01)

(52) U.S. Cl.
    CPC ............ H01L 33/507 (2013.01); H01L 33/60 (2013.01); H01L 33/62 (2013.01); H01L 33/64 (2013.01); H01L 33/647 (2013.01); H01L 2224/16225 (2013.01); H01L 2224/45144 (2013.01); H01L 2224/48091 (2013.01); H01L 2224/49107 (2013.01); H01L 2924/12041 (2013.01); H01L 2924/12042 (2013.01); H01L 2924/15747 (2013.01); H01L 2924/15787 (2013.01); H01L 2933/0016 (2013.01); H01L 2933/0025 (2013.01); H01L 2933/0033 (2013.01); H01L 2933/0041 (2013.01); H01L 2933/0058 (2013.01)

(58) Field of Classification Search
    CPC ............ H01L 2224/0554–2224/05572; H01L 33/0079; H01L 24/97; H01L 33/36–33/405; H01L 25/167; H01L 25/075–25/0756; H01L 25/13; H01L 33/483–33/486
    See application file for complete search history.

(56) References Cited

U.S. PATENT DOCUMENTS

| | | | | |
|---|---|---|---|---|
| 2008/0048206 | A1* | 2/2008 | Lee | H01L 33/387 257/103 |
| 2008/0277674 | A1 | 11/2008 | Nagai et al. | |
| 2009/0081867 | A1* | 3/2009 | Taguchi | H01L 24/97 438/675 |
| 2009/0283787 | A1* | 11/2009 | Donofrio | H01L 33/405 257/98 |
| 2010/0078670 | A1 | 4/2010 | Kim et al. | |
| 2010/0102350 | A1* | 4/2010 | Jeong | H01L 33/44 257/98 |
| 2010/0140640 | A1* | 6/2010 | Shimokawa | H01L 33/0079 257/98 |
| 2010/0148198 | A1* | 6/2010 | Sugizaki | H01L 33/44 257/98 |
| 2010/0295087 | A1 | 11/2010 | Baek et al. | |
| 2011/0006322 | A1* | 1/2011 | Li | H01L 33/486 257/98 |
| 2011/0114978 | A1 | 5/2011 | Kojima et al. | |
| 2011/0147779 | A1* | 6/2011 | Kang | H01L 33/486 257/98 |
| 2011/0169034 | A1* | 7/2011 | Tseng | H01L 33/486 257/98 |
| 2011/0233585 | A1* | 9/2011 | Kojima | H01L 33/486 257/98 |
| 2011/0291141 | A1* | 12/2011 | Sorimachi | H01L 33/405 257/98 |
| 2011/0297980 | A1* | 12/2011 | Sugizaki | H01L 33/38 257/98 |
| 2011/0297983 | A1* | 12/2011 | Nishiuchi | H01L 33/647 257/98 |
| 2011/0297987 | A1* | 12/2011 | Koizumi | H01L 33/44 257/98 |
| 2012/0302124 | A1* | 11/2012 | Imazu | H01L 33/486 445/58 |
| 2012/0313131 | A1* | 12/2012 | Oda | H01L 23/49503 257/98 |
| 2012/0319159 | A1* | 12/2012 | Nakatani | H01L 25/167 257/99 |
| 2014/0246648 | A1* | 9/2014 | Im | H01L 33/382 257/13 |
| 2015/0340566 | A1* | 11/2015 | Butterworth | H01L 33/0079 257/98 |
| 2015/0349223 | A1* | 12/2015 | Lee | H01L 33/62 257/99 |
| 2015/0349225 | A1* | 12/2015 | Oh | H01L 33/38 257/99 |

FOREIGN PATENT DOCUMENTS

| | | |
|---|---|---|
| EP | 2 400 566 | 12/2011 |
| JP | 2003-168828 | 6/2003 |
| JP | 2004-363279 | 12/2004 |
| JP | 2006-093672 | 4/2006 |
| JP | 2009-129928 | 6/2009 |
| JP | 2010-287837 | 12/2010 |
| JP | 2011-108911 | 6/2011 |
| JP | 2011-159837 | 8/2011 |
| JP | WO 2011093454 A1 * | 8/2011 ........... H01L 33/486 |
| JP | 2011-233821 | 11/2011 |
| JP | 2011-258675 | 12/2011 |
| JP | 2011-258676 | 12/2011 |
| WO | 2008/088165 | 7/2008 |
| WO | 2011/093454 | 8/2011 |
| WO | WO 2011093454 A1 * | 8/2011 |
| WO | 2011/122665 | 10/2011 |

OTHER PUBLICATIONS

International Search Report issued May 7, 2013 in International (PCT) Application No. PCT/JP2013/000432 with English translation.

Extended European Search Report issued Sep. 21, 2015 in corresponding European Patent Application No. 13749394.6.

* cited by examiner

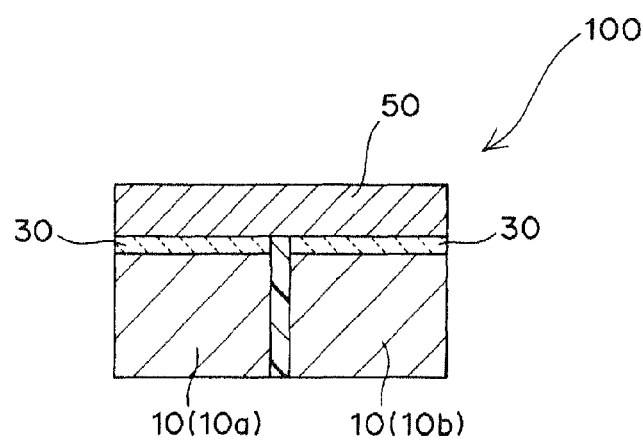
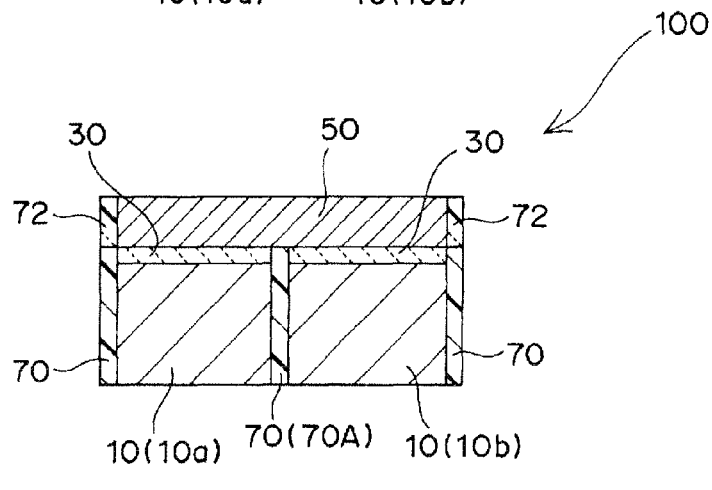
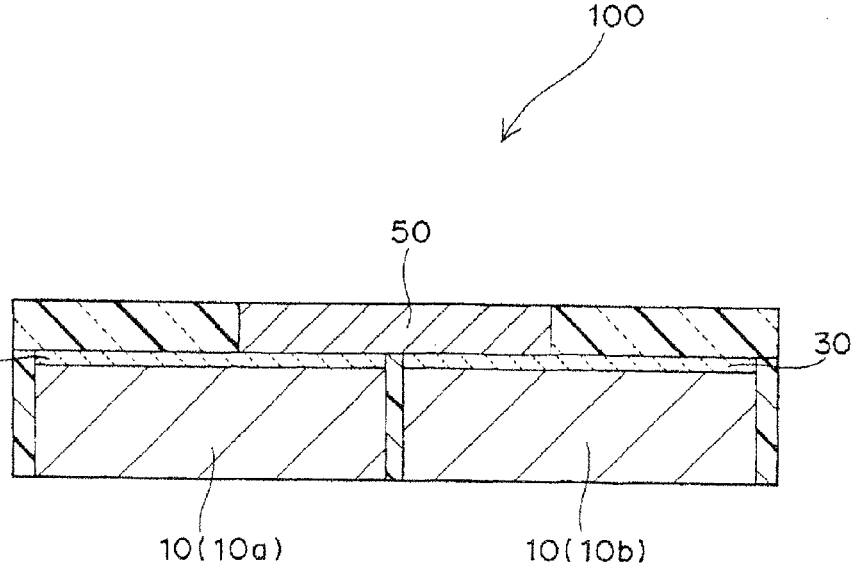

Central portion "A1"
(Light-emitting element region)

Central portion "A2"
(Light-emitting element region)

(Light-emitting element region and adjacent region thereto)

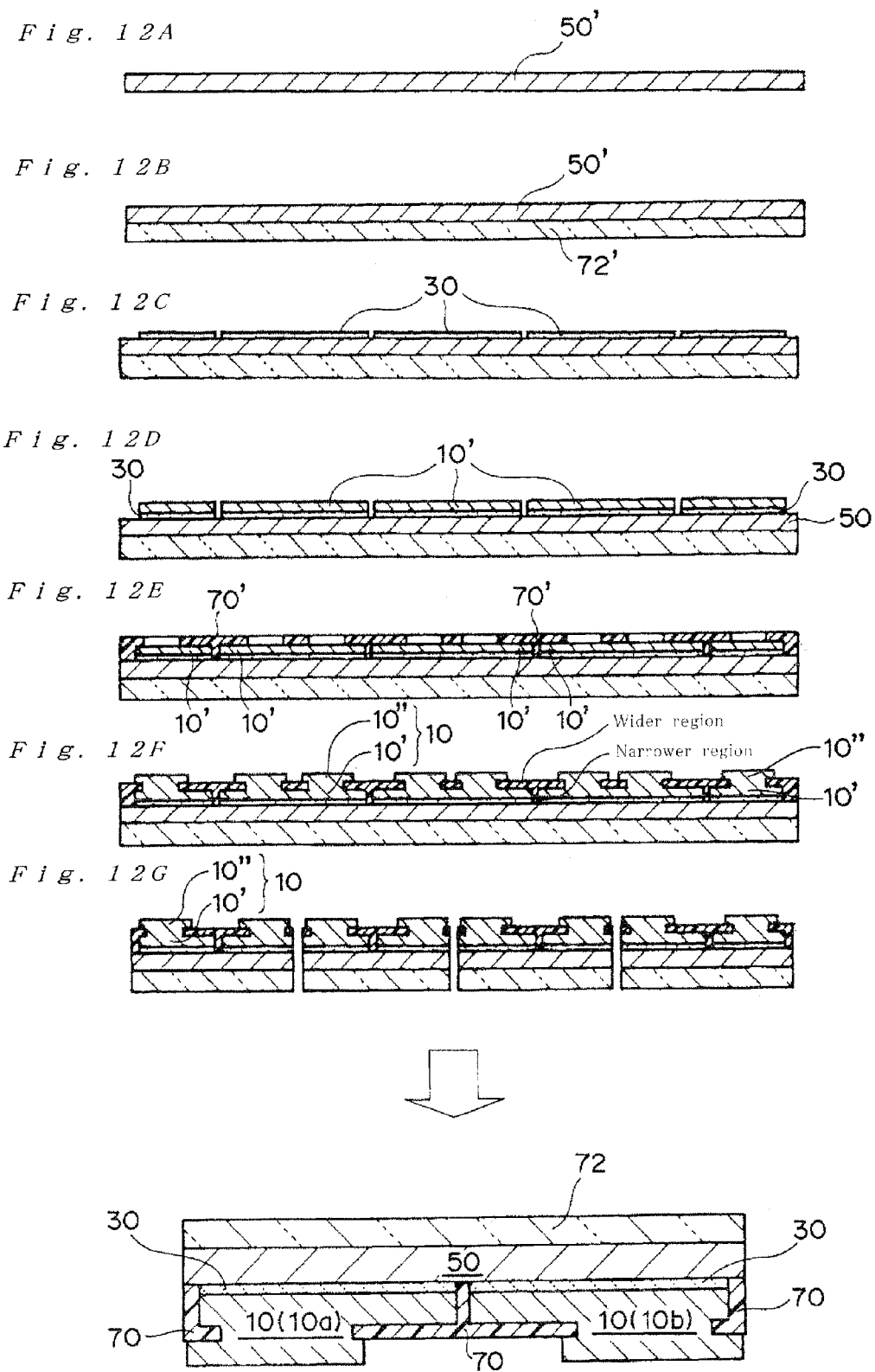

*Fig. 15A*
Patterned formation of insulating layer
(In case where insulating layer raw material is photosensitive material)

(a) Allover formation of insulating layer (Spin coating/Doctor blade)

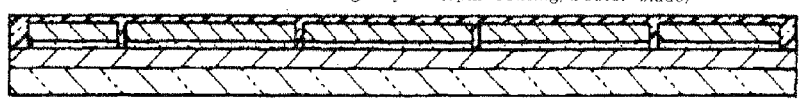

(b) Exposure (Mask exposure)    UV    Mask for exposure

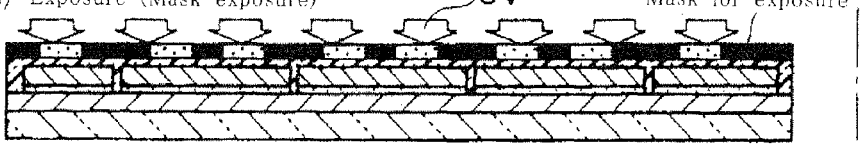

(c) Development    70'

*Fig. 15B*
Patterned formation of insulating layer
(In case where insulating layer raw material is not photosensitive material)

Patterned printing of insulating layer

Fig. 16A
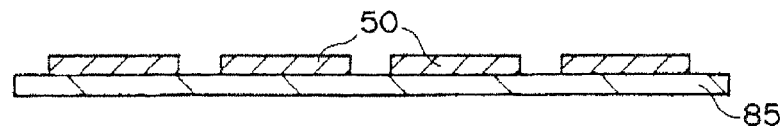
Fig. 16B
Fig. 16C
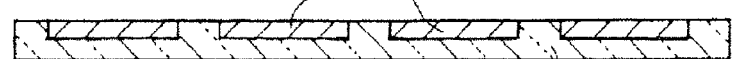
Fig. 16D
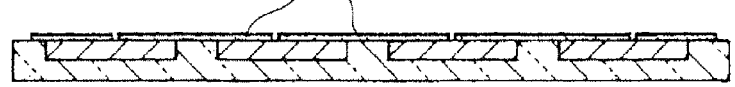
Fig. 16E
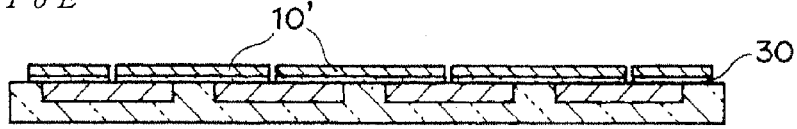
Fig. 16F
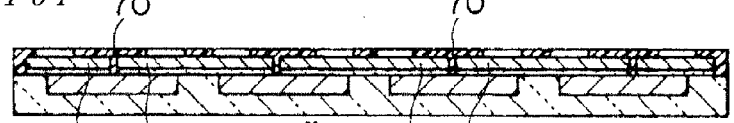
Fig. 16G
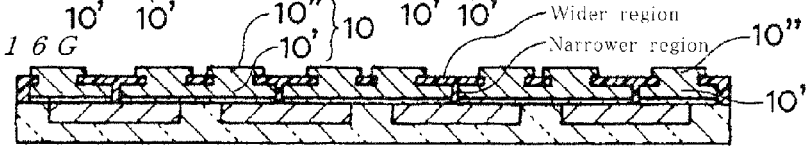
Fig. 16H
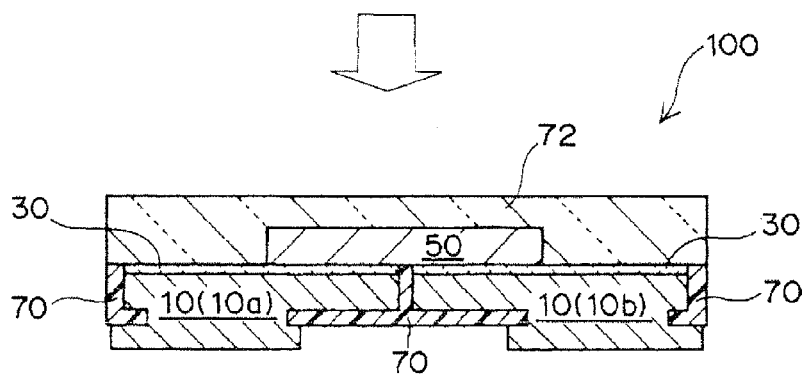

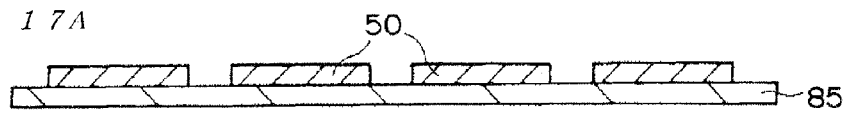
Fig. 17A
Fig. 17B
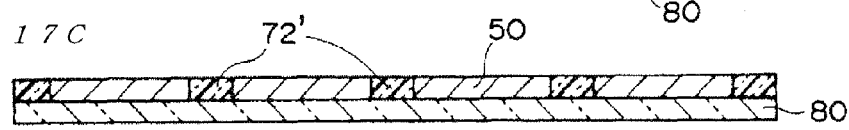
Fig. 17C
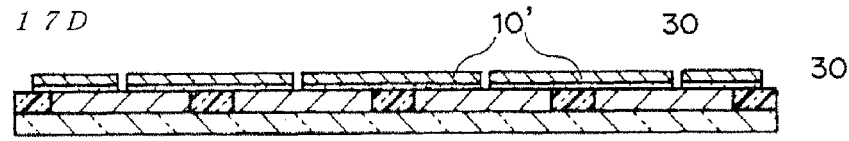
Fig. 17D
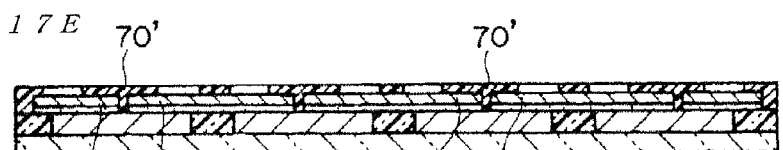
Fig. 17E
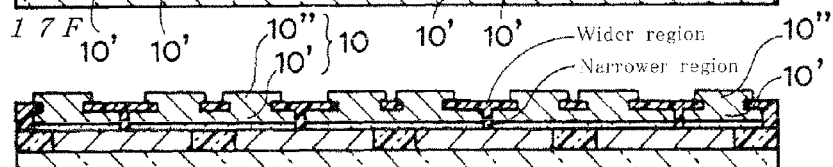
Fig. 17F
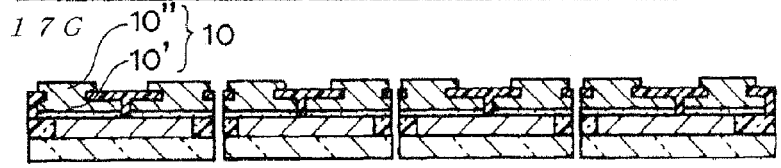
Fig. 17G
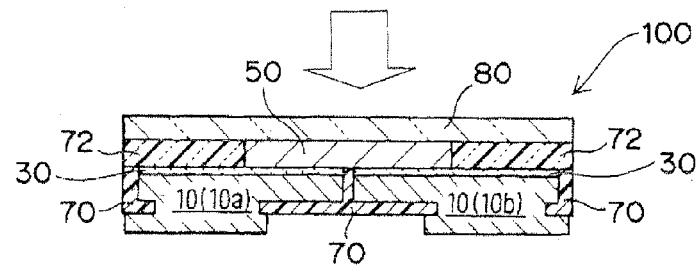
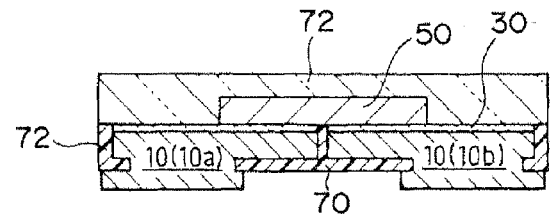

Fig. 18A
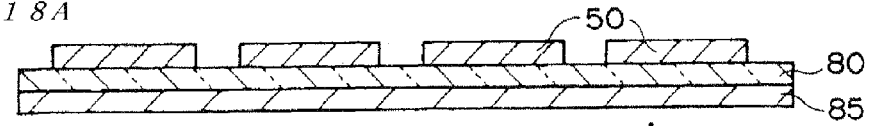
Fig. 18B
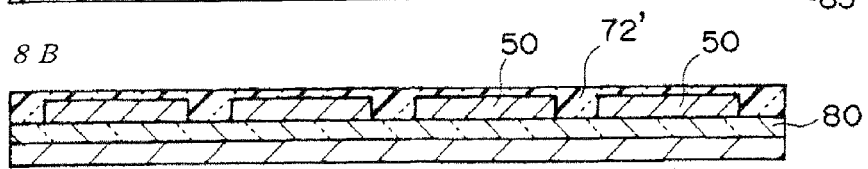
Fig. 18C
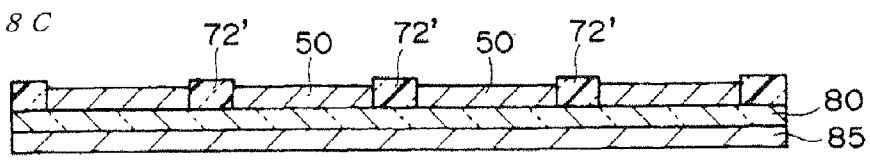
Fig. 18D
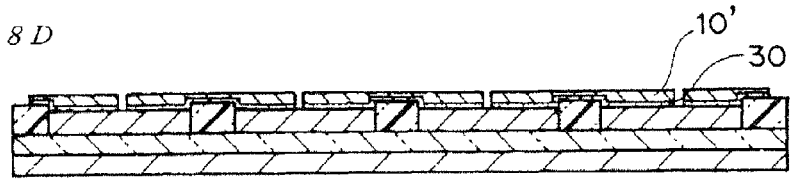
Fig. 18E
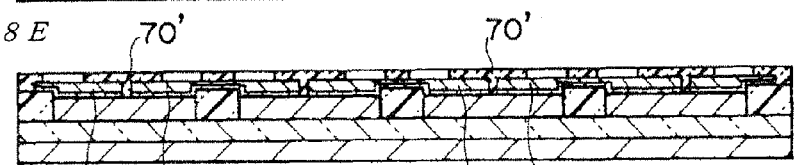
Fig. 18F
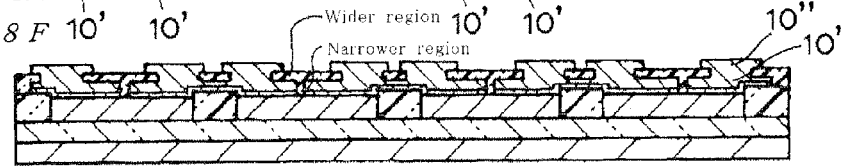
Fig. 18G
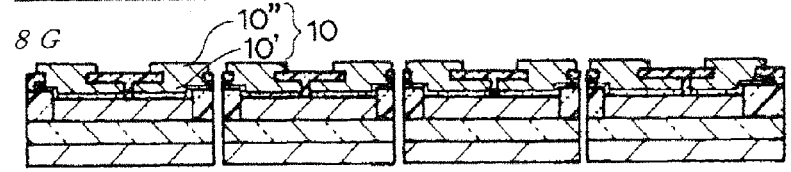
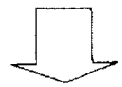
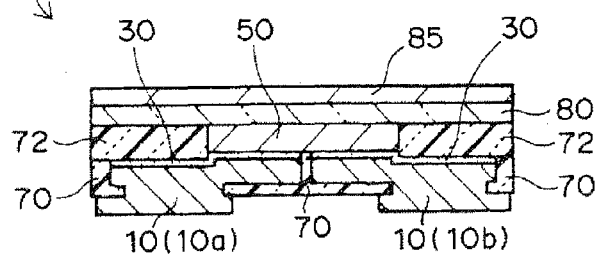

*Fig. 20A*
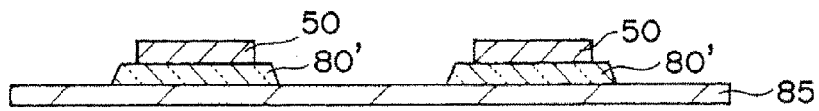
*Fig. 20B*
*Fig. 20C*
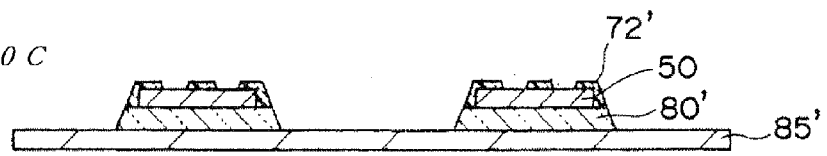
*Fig. 20D*
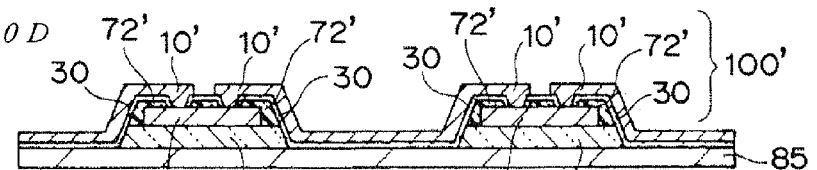
*Fig. 20E*
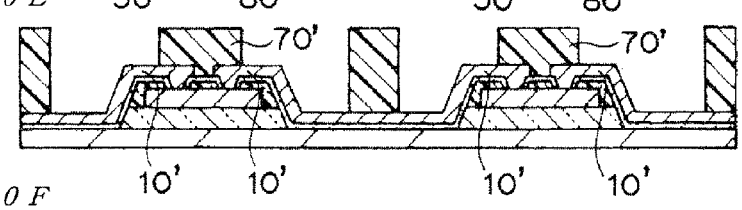
*Fig. 20F*
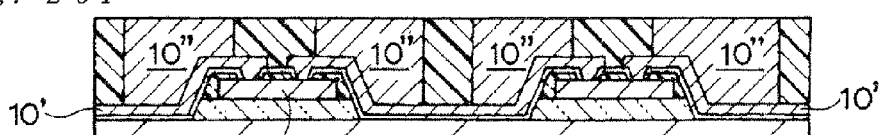
*Fig. 20G*
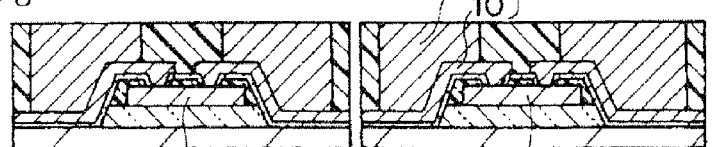
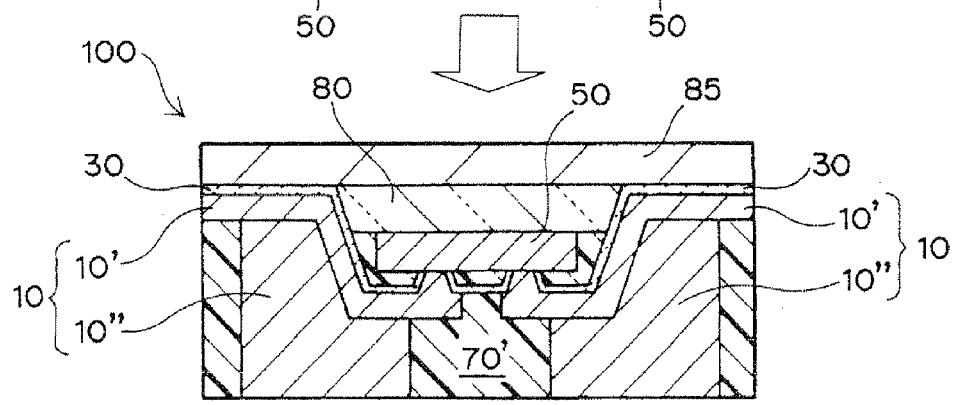

Lower point below central portion of light-emitting element

W/B Type

F/C Type

LIGHT-EMITTING DEVICE AND METHOD FOR MANUFACTURING THE SAME

TECHNICAL FIELD

The present invention relates to a light-emitting device and a method for manufacturing the light-emitting device. More particularly, the present invention relates to a light-emitting device equipped with a light-emitting diode (which is referred to also as "LED" hereinafter) and a method for manufacturing such device.

BACKGROUND OF THE INVENTION

In recent years, a LED has been used in various applications because it is considered as being energy-saving light source and having a long lifetime. For example, the LED is used as backlight source for display device (e.g., liquid crystal display). Furthermore the LED is used in camera flash applications and automotive applications, and also in various lighting applications.

The high brightness of the LED is generally achieved by an increase in an applied current to the LED, i.e., by an increase in the amount of light. The increased current applied to the LED, however, can be a severe operating condition for the LED, causing the performance of the LED to be degraded. The degradation of the LED inhibits the long lifetime and high reliability in the LED package and module. For example, when an electric current through the LED is increased, the heat attributed to the LED increases. Accordingly, the temperature tends to rise in the LED module for lighting and a system thereof, which leads to a deterioration of the LED module and the system. In this regard, only about 25% of the electric power to be consumed in the white LED is converted into the visible light and the rest of the electric power is directly converted into the heat. Therefore, it is required to release the heat from the LED package, and thus various types of heat sinks are used to this end.

PATENT DOCUMENTS

Prior Art Patent Documents

PATENT DOCUMENT 1: JP-A-2009-129928
PATENT DOCUMENT 2: WO 08/088165 A

DISCLOSURE OF THE INVENTION

Problems to be Solved by the Invention

The currently-used LED chip can be classified into two mounting types of "Wire Bonding type (W/B type)" and "Flip Chip type (F/C type)". According to the "Wire Bonding type (W/B type)", an electrode of the LED chip faces upward, and a gold wire is in connection to the upward electrode to ensure an electrical connection of the LED chip (see FIG. 23A). While on the other hand, according to the "Flip-Chip type (F/C type)", an electrode of the LED chip faces downward, and a gold bump is in connection to the downward electrode to ensure an electrical connection of the LED chip (see FIG. 23B).

As a result of extensive studies by the inventors, they have found that the "Flip Chip type (F/C type)" is preferable in view of light extraction from the LED chip because of no light-blocking over the LED chip, but it is not necessarily preferable in view of heat releasing because of the gold bump being thermal resistance. More specifically, an area occupied by the gold bumps in the LED chip is small (for example, the occupied area is no more than about 25% of the surface area of the LED chip when estimated at a maximum), and thus the gold bump unfavorably serves as a rate-determining part with respect to the heat dissipation, which leads to an insufficiency of the heat releasing of the device of the flip-chip type. The thermal resistance of the gold bumps implies that the heat can be generated in the area where the gold bumps are provided (i.e., in the mounting area of the device). The "Flip Chip type (F/C type)", even if a substrate with high heat dissipation is used, cannot achieve a high heat-releasing performance of the chip since the transmission of the heat toward the substrate is prevented (see FIG. 23B).

While on the other hand, the "Wire Bonding type (W/B type)" is preferable in terms of the heat-releasing performance since thermal vias can be disposed directly under the LED chip as shown in FIG. 23A. However, it is not preferable in terms of the light extraction because the electrodes on the upper surface of the LED chip can limit the light extraction area of the LED to reduce the amount of the light extraction. Furthermore, the wire itself can block the emitted light in the device of the wire-bonding type, which also reduces the amount of the light extraction.

The present invention has been created under the above circumstances. In other words, a main object of the present invention is to provide a light-emitting device capable of satisfying the both performances of the heat releasing and the light extraction.

Means for Solving the Problem

Rather than addressing as merely extensions of conventional arts, the inventors tried to accomplish the above main object by addressing from a new point of view. As a result, the inventors have created the invention of the light-emitting device which is capable of achieving the above main object. The present invention provides a light-emitting device comprising:
an electrode part for light-emitting element;
a reflective layer provided on the electrode part; and
a light-emitting element provided on the reflective layer such that the light-emitting element is in contact with at least a part of the reflective layer,
wherein the light-emitting element and the electrode part are in electrical connection with each other by mutual surface contact (or "direct bonding"/"surface bonding") thereof via the at least a part of the reflective layer, and
wherein the electrode part serves as a supporting layer for supporting the light-emitting element.

One of the features of the light-emitting device according to the present invention is that the light-emitting element and the electrode part for light-emitting element (referred to also as "light-emitting element electrode part" hereinafter) are in the electrical connection with each other by the mutual surface contact of the light-emitting element and the electrode part, and that the light-emitting element electrode part serves as the supporting layer for supporting the light-emitting element. In other words, the electrode part in the light-emitting device according to the invention is provided substantially directly on the light-emitting element, and such "direct electrode part" serves as the supporting layer in the light-emitting device. Namely, the electrode part formed by a direct metallizing with respect to the light-emitting element can be regarded as a direct-metallized layer, serving as the supporting layer in the device.

The term "light-emitting element" used herein substantially means an element capable of emitting light. Examples of the light-emitting element include a light-emitting diode (LED) and an electronic component equipped therewith. Accordingly, the term "light-emitting element" in the present invention means not only a "bare chip type LED (i.e., LED chip)" but also a "discrete type light-emitting element wherein a molding of the LED chip is provided". The LED chip may also be a semiconductor laser chip.

The term "light-emitting device" used herein substantially means a light-emitting element package (especially "LED package"), and also "product with a plurality of LEDs arranged in a form of array". In other words, the light-emitting device of the present invention encompasses not only a so-called "single-chip" device but also a "multi-chip" device, unless otherwise specified herein. Similarly, the light-emitting device of the present invention encompasses not only "device exhibiting light directivity" but also "device exhibiting no light directivity", unless otherwise specified herein.

Furthermore, the term "electrode part for light-emitting device" (i.e., "light-emitting element electrode part") as used herein substantially means an electrode which is different from an inherently provided electrode of the light-emitting element. For example, the electrode part for light-emitting device, i.e., the light-emitting element electrode part is different from P-type electrode/N-type electrode of the light-emitting element.

In a preferred embodiment, the electrode part for light-emitting element extends toward the outside of the light-emitting element and beyond the light-emitting element. That is, the electrode part (and also the reflective layer provided thereon) is not only provided in a lower region of the light-emitting element, but also laterally extends such that it reaches an outside area of the light-emitting element.

Furthermore, the present invention also provides a method for manufacturing the light-emitting device as described above. That is, the method is provided for manufacturing the "light-emitting device wherein the light-emitting element and the electrode part are in the electrical connection with each other by the mutual surface contact thereof and the electrode part serves as the supporting layer for supporting the light-emitting element". The method according to the present invention comprises:

(i) providing the light-emitting element; and
(ii) forming an electrode part on the light-emitting element, the electrode part being for the light-emitting element, wherein, in the step (ii), a foundation layer for the formation of the electrode part is formed on the light-emitting element, and thereafter the electrode part is formed such that the electrode part makes surface contact (or "direct bonding"/"surface bonding") with the light-emitting element via the foundation layer, and wherein the foundation layer is eventually used as a reflective layer of the light-emitting device.

One of the features of the manufacturing method according to the present invention is that the electrode part is directly formed on the light-emitting element and the electrode foundation layer used for such direct formation of the electrode part is eventually used as the reflective layer of the light-emitting device.

Effect of the Invention

In accordance with the light-emitting device of the present invention, the both performances of "heat releasing" and "light extraction" can be suitably achieved (see FIG. 1).

Specifically, "surface contact between the light-emitting element and the light-emitting element electrode part" can result in a wider area occupied by the light-emitting element electrode part in the light-emitting element, which leads to a suitable achievement of the high heat-releasing performance. Furthermore, there is provided such a structure that the light-emitting element is positioned over the light-emitting element electrode part, i.e., a face-down structure where the electrode of the light-emitting element faces downward. This means that such an inconvenience that "electrode/bump on the upper side of the light-emitting element blocks light" can be avoided, which can increase the amount of the extracted light from the device.

With respect to the "heat-releasing performance" according to the present invention, a mounting with a bump is not provided (that is, there is provided a mounting-less/bump-less device), which enables the heat from the light-emitting element to be released effectively via the area of "surface contact of the light-emitting element and the electrode part". In this regard, the light-emitting element electrode part can be made of a material with high thermal conductivity (e.g., copper material), and also can be provided as "electrode part with its large thickness" and/or "electrode part with its large size in a width direction thereof". Therefore, the present invention makes it possible to effectively release the heat via the electrode part to the outside thereof. It should be noted that the reflective layer itself is made of a suitable material (e.g., metal material) which at least exhibits the thermal conductivity, and also is provided in a very thin form, and thus the thermal resistance of the reflective layer is negligibly small.

With respect to the "light extraction performance", the face-down structure according to the present invention makes it possible not only to extract the light effectively from the upper surface of the light-emitting device, but also to extract the light effectively from the lower surface of the light-emitting device due to the presence of the reflective layer. In this regard, the "reflective layer with high reflectivity" is provided directly under the light-emitting element, and thus the light emitted downward from the light-emitting element can be effectively reflected by the reflective layer, which leads to an effective utilization of the downward-emitted light. That is, the light-emitting device of the present invention has a desirable structure for extracting the light not only from the upper surface of the device but also from the lower surface of the device.

Furthermore, the light-emitting device of the present invention has a "substrate-less structure". In this regard, the electrode part serves as the supporting layer for supporting the light-emitting element in the light-emitting device of the present invention. The substrate-less structure can lead to the downsizing of the device and also contributes to the low cost of the manufacturing. As such, the device of the present invention can have a suitable flexibility, compared to the conventional device with the high heat-releasing substrate (e.g., ceramic substrate) being used therein as a supporting part.

The device of the present invention also has such a suitable structure that is capable of wiring directly from the light-emitting element and also achieving a form of array, thereby providing a higher degree of design freedom. Moreover, the device of the present invention has a satisfactory stability of the connection due to the "mounting-less/bump-less".

When focusing on the manufacturing method of the present invention, the method has such more simplified processes that the electrode part is directly formed on the light-emitting element and the electrode foundation layer used for the direct formation of the electrode part is eventually used as the reflective layer of the light-emitting device. The simplified manufacturing processes can provide the light-emitting device which is capable of satisfying the both performances of "heat releasing" and "light extraction". Also, the foundation layer in itself can contribute to the formation of the light-emitting element electrode part (in particular, the formation of the electrode part having a large thickness), while being eventually used as the "reflective layer contributing to the light extraction". This means that the formation of the foundation layer contributes to not only the improved process, but also the improved final product. In addition, the manufacturing method of the present invention provides a variety of advantageous effects. For example, there is provided such an effect that the redistribution of the wiring can be applied directly to the light-emitting element (e.g., a LED chip), an effect that a wafer-sized chip can be positioned arbitrarily, and an effect that the LED can be sealed on a carrier layer (and thus a light-emitting surface can be smooth), and the like.

BRIEF DESCRIPTION OF THE DRAWINGS

FIGS. 2A to 2C are cross-sectional views schematically illustrating configurations of the light-emitting device wherein FIG. 2A shows the configuration of the light-emitting device having a chip size or wafer size according to the present invention (i.e., the light-emitting device in which the entire width size thereof is equal to the width size of the light-emitting element), FIG. 2B shows the configuration of the light-emitting device having a substantially chip-size or substantially wafer-size according to the present invention (i.e., the light-emitting device in which the entire width size thereof is approximately equal to the width size of the light-emitting element), and FIG. 2C shows the configuration of the light-emitting device according to the present invention where the electrode part extends toward the outside of the light-emitting element and beyond the light-emitting element.

FIGS. 12A to 12G are process-cross sectional views schematically illustrating a manufacturing method according to the present invention with respect to "Process Embodiment 1".

FIGS. 15A(a) to 15A(c) are process-cross sectional views schematically illustrating a forming of an insulating layer pattern when raw material for an insulating layer is a photosensitive material.

FIG. 15B is a process-cross sectional view schematically illustrating a forming of an insulating layer pattern when raw material for an insulating layer is not a photosensitive material.

FIGS. 16A to 16H are process-cross sectional views schematically illustrating a manufacturing method according to the present invention with respect to "Process Embodiment 2".

FIGS. 17A to 17G are process-cross sectional views schematically illustrating a manufacturing method according to the present invention with respect to "Process Embodiment 3".

FIGS. 18A to 18G are process-cross sectional views schematically illustrating a manufacturing method according to the present invention with respect to "Process Embodiment 4".

FIGS. 20A to 20G are process-cross sectional views schematically illustrating a manufacturing method according to the present invention with respect to "Process Embodiment 5".

DETAILED DESCRIPTION OF THE INVENTION

Figure 1:
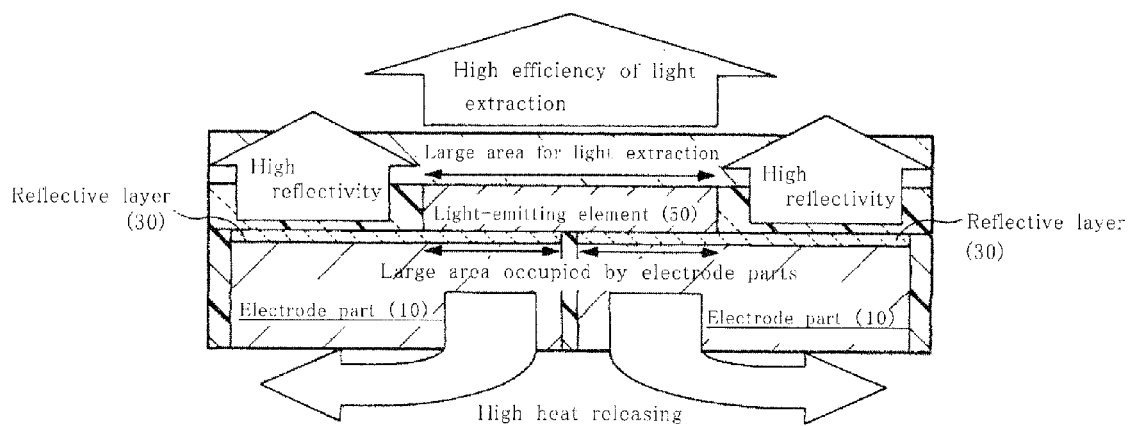
FIG. 1 is a schematic cross-sectional view for explaining functions and effects of the light-emitting device of the present invention.

A light-emitting device and a manufacturing method therefor according to the present invention will be hereinafter described in more detail. It should be noted that various parts or elements are schematically shown in the drawings wherein their dimensional proportions and their appearances are not necessarily real ones, and are merely for the purpose of making it easy to understand the present invention.

[Light Emitting Devices of the Present Invention]

FIGS. 2A-2C schematically illustrate structures of a light-emitting device according to the present invention. As illustrated, the light-emitting device 100 of the present invention comprises an electrode part for light-emitting element (i.e., light-emitting element electrode part) 10, a reflective layer 30 and a light-emitting element 50. The light-emitting element 50 is positioned over the light-emitting element electrode part 10, and also the light-emitting element 50 is in contact with at least a part of the reflective layer 30 on the electrode parts.

Figure 3:
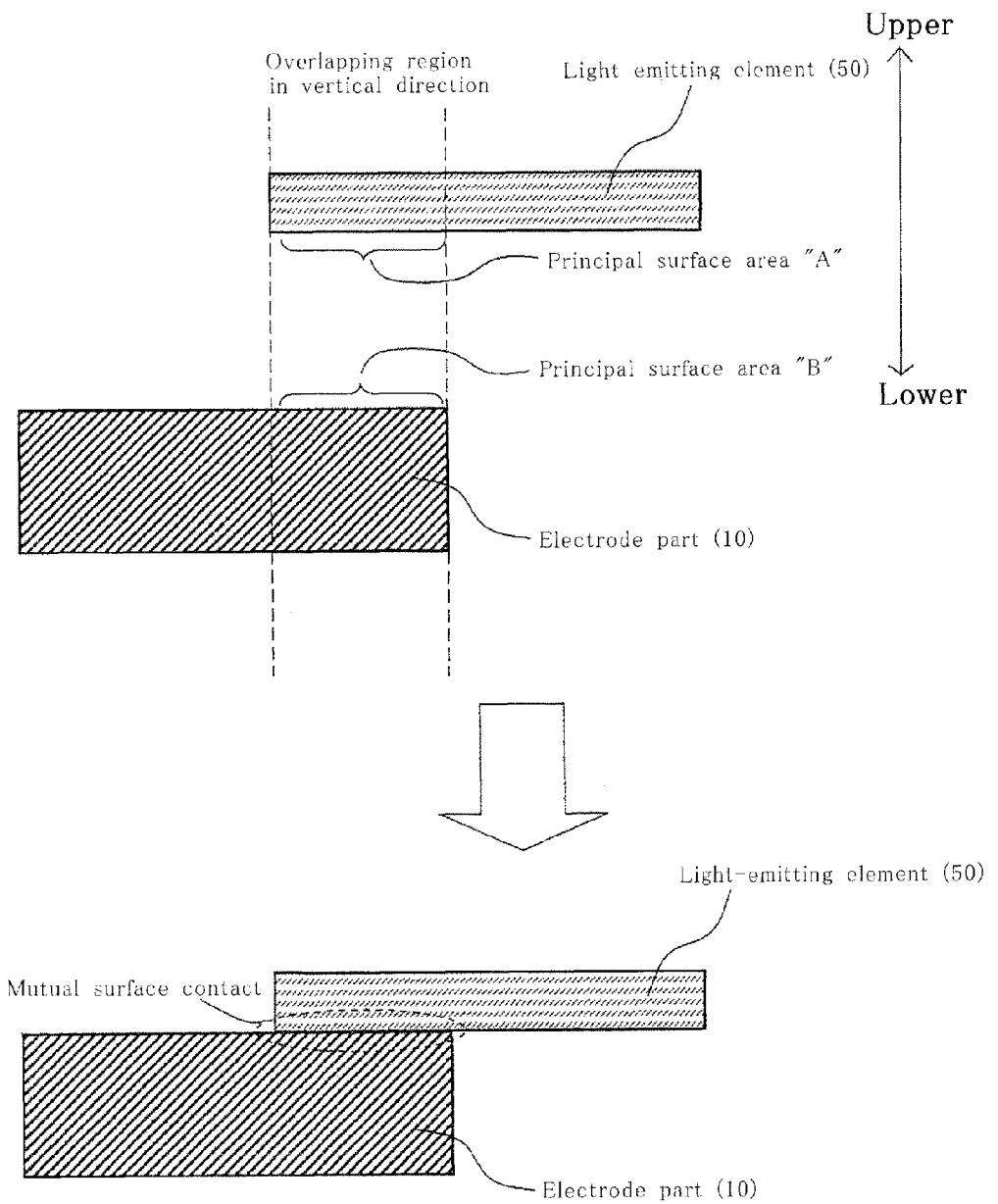
FIG. 3 includes schematic views for explaining "surface contact" according to the present invention.

In the light-emitting device 100 of the present invention, the light-emitting element 50 and the light-emitting element electrode part 10 have mutual surface contact (or direct bonding/surface bonding) with each other via the reflective layers 30 as illustrated in FIGS. 2A-2C. As such, the light-emitting element 50 and the light-emitting element electrode part 10 are in an electrical connection with each other. The term "surface contact" (or direct bonding/surface bonding) used herein means an embodiment wherein principal surfaces of respective ones of the part and element are contacted or bonded with each other, in particular an embodiment wherein overlapping regions between the principal surfaces of respective ones of the part and element are all contacted or all bonded with each other. More specifically, the term "surface contact" (or direct bonding/surface bonding) means an embodiment wherein the overlapping regions between "principal surface of the light-emitting element (i.e., lower principal surface of the element)" and "principal surface of the light-emitting element electrode part (i.e., upper principal surface of the part)" are all contacted or all bonded with each other. In other words, the term "surface contact" used herein means an embodiment wherein the mutual overlapping regions of the light-emitting element and the light-emitting element electrode part are all contacted or all bonded, which corresponds to an embodiment shown in FIG. 3 where "principal surface area "A"" and "principal surface area "B"" are all contacted or all bonded with each other.

The reflective layer 30 positioned between the light-emitting element 50 and the light-emitting element electrode part 10 is such a thin layer that exhibits the negligible thermal resistance or electrical resistance. As such, it can be considered in the present invention that the light-emitting element 50 and the light-emitting element electrode part 10 are in direct surface contact with each other.

The reflective layer 30 is very thin, whereas the light-emitting element electrode part 10 is thick. The light-emitting element electrode part 10 with such a large thickness suitably functions, substantially as a supporting layer for supporting the light-emitting element 50. That is, the light-emitting element electrode part 10 positioned underneath the light-emitting element 50 is relatively thick and in all surface contact with the light-emitting element 50 in the range of overlapping with the light-emitting element 50, and thereby serving as a platform for supporting the light-emitting element 50. The light-emitting element electrode part 10 is composed of a positive electrode portion 10a (i.e., an electrode connected to a P-type electrode of the light-emitting element) and a negative electrode portion 10b (i.e., an electrode connected to a N-type electrode of the light-emitting element). The positive electrode portion 10a and the negative electrode portion 10b are in surface contact with the light-emitting element 50 in the range of overlapping with the light-emitting element 50 and thus serve suitably as supporting layers for supporting the light-emitting element 50, respectively.

The light-emitting element electrode part 10 according to the present invention is in the "surface contact" with the light-emitting element 50, and thereby the electrode part 10 is capable of effectively releasing the heat from the light-emitting element via such electrode part to the outside of the element. That is, the light-emitting element electrode part 10 functions not only as the supporting layer of the light-emitting device, but also as a heat sink which effectively contributes to the high-heat releasing performance of the light-emitting device. As for a general light-emitting element (e.g., general LED), when having high temperatures, its luminous efficiency (i.e., a ratio of a driving current converted to light) is lowered and thus its luminance is lowered. In this regard, the light-emitting device of the present invention has the high heat-releasing performance, and thereby achieving the high luminous efficiency and the high luminance. Due to the high heat-releasing performance, an operating lifetime of the light-emitting element can be increased, and also degeneration and discoloration of the sealing resin, which are attributed to the heat, can be effectively prevented. Furthermore, the light-emitting element electrode part 10 and the light-emitting element 50 are in the "surface contact" with each other, and thus the electric resistance of the device is more desirable than that of the case wherein they are electrically connected via bump or wire. As such, the present invention enables a larger electric current to be applied in the device. The larger electric current in the light-emitting element electrode part and the light-emitting element can lead to an achievement of not only the higher luminance of the device but also the downsizing of the light-emitting element.

A material for the light-emitting element electrode parts 10 may be, but is not necessarily limited to, a general material as an electrode material of general LEDs. For example, at least one metal material selected from the group consisting of copper (Cu), silver (Ag), palladium (Pd), platinum (Pt) and nickel (Ni) can be used as a main material for the electrode part. In a case where "heat releasing performance" is particularly regarded as important factor of the device, it is preferred that the material having high thermal conductivity and contributing effectively to the high heat-releasing performance is used as the material for the light-emitting element electrode part 10. In this regard, copper (Cu) is particularly preferred for the material of the electrode part. It should be noted that the light-emitting element electrode part 10 can be provided as a wet plating layer (preferably, an electroplating layer) for example, which will be later described.

The light-emitting element electrode part 10 according to the present invention has a relatively large thickness, and thereby effectively contributing to the supporting function and also the heat sink function in the device. For example, the light-emitting element electrode part 10 is thicker than the reflective layers 30. In one preferred embodiment of the present invention, the light-emitting element electrode part 10 is thicker than the light-emitting element 50. Specifically, the thickness of the light-emitting element electrode part 10 (e.g., the maximum thickness of the electrode part) is larger than the thickness of the light-emitting element 50 (e.g., the maximum thickness of the light-emitting element). By way of example, the thickness of the light-emitting element electrode part 10 is preferably in the approximate range of 30 µm to 500 µm, more preferably in the approximate range of 35 µm to 250 µm, and still more preferably in the approximate range of 100 µm to 200 µm.

The reflective layer 30, which is on the surface portion of the light-emitting element electrode part 10, is positioned directly beneath the light-emitting element 50. Therefore, the light emitted downward from the light-emitting element 50 can be effectively reflected by the reflecting layer 30. That is, the downward light can be directed to be upward light. This means that the luminous efficiency can be improved by the reflective layer 30 disposed directly beneath the light-emitting element 50, and thereby the high luminance can be achieved in the light-emitting device. As such, the light-emitting device of the present invention can achieve not only the heat sink function due to the presence of the light-emitting element electrode part 10, but also the high luminance due to the presence of the reflective layers 30.

A material for the reflective layer 30 may be any suitable material which is capable of reflecting the light. For example, at least one metal material selected from the group consisting of Ag (silver), Al (aluminum), Al alloy, Au (gold), Cr (chromium), Ni (nickel), Pt (platinum), Sn (Tin), Cu (copper), W (tungsten), Ti (titanium) and the like may be used as the material for the reflective layer 30. As will be later described, the reflective layer 30 serves as a foundation layer (i.e., electrode foundation layer) for the formation of the light-emitting element electrode part 10, and thus the reflective layer 30 is preferably made of a metal material selected from the group consisting of Ti (titanium), Cu (copper), Ni (nickel) and the like. In a case where the high reflection performance is particularly regarded as important factor of the device, the reflective layer 30 is preferably made of the metal material selected from the group consisting of Ag (silver), Al (aluminum) and the like. The reflective layer 30 made of the metal material exhibits thermal conductivity and electrical conductivity, and thus can form a portion of the electrode. It should be noted that the reflective layer serves as a foundation layer of the electrode part as will be later described. That is, the reflective layer 30 can be regarded as a portion of the light-emitting element electrode part 10, particularly as an "electrode portion exhibiting high reflectivity" located directly underneath the light-emitting element. It should also be noted that a form of the reflective layer 30 is not limited to a single layer form and may be a stacked-layers form. For example, the reflective layer 30 may be composed of a Ti thin film layer and a Cu thin film layer. In this case, the Ti thin film layer corresponds to "upper layer" whereas the Cu thin film layer corresponds to "lower layer" in the figures (based on the vertical direction shown in FIG. 2, for example). As described below, the reflective layer itself may be provided as a dry plating layer (preferably, as a sputtering layer), for example.

As for the "direct surface contact between the light-emitting element and the light-emitting element electrode part", the reflective layer 30 is very thin enough to have a substantially negligible thermal resistance or electrical resistance, and thus may have thickness of nano-order, for example. By way of example, the reflective layer 30 has very small thickness of 100 nm to 500 nm (or thickness in the approximate range of 100 nm to 300 nm depending on the kind of the material of the reflective layer), and thus the reflective layer 30 can be regarded as the thin film layer in the device.

The light-emitting element 50 of the present invention may be not only a "bare chip type LED (i.e., LED chip)" but also a "discrete type light-emitting element wherein a molding of the LED chip is provided". The LED chip may be one used in a general LED package, and thus it can be suitably selected according to the use application of the LED package. As appropriate, what is called a non-polar LED (i.e., non-polar type LED chip) can be used. The number of the light-emitting element 50 is not limited to "single" and may be "plural". That is, the light-emitting device 100 of the present invention can be realized not only in a form of "single-chip" as shown in FIG. 2, but also in a form of "multi-chip".

The light-emitting device 100 of the present invention has the "surface contact between the light-emitting element 50 and the light-emitting element electrode part 10", and thereby the heat from the light-emitting element 50 can be suitably released. In other words, the area occupied by the light-emitting element electrode part 10 in the principal surface of the light-emitting element 50 is larger due to the surface contact, and thus the higher heat-releasing performance can be achieved. For example, the ratio of the area occupied by the light-emitting element electrode part 10 (i.e., "light-emitting element electrode part composed of the positive electrode portion 10*a* and the negative electrode portion 10*b*") on the lower principal surface of the light-emitting element 50 is 40% or more, preferably in the range of 50% to 90%, more preferably in the range of 70% to 90%. As such, the occupied area by the light-emitting element electrode part is larger due to the "surface contact", and thereby the thermal resistance of the "connecting portion between the light-emitting element and the electrode part" is not a rate-limiting factor in terms of thermal resistance of the whole device according to the present invention, which leads to an achievement of the higher heat-releasing performance. Furthermore, the thickness of the light-emitting element electrode part is larger according to the present invention, which can also improve the heat-releasing performance. In other words, the mounting of the light-emitting element, for example, via the bump is not performed in the present invention, and instead the thick electrodes are in direct contact with the light-emitting element, and thereby achieving the higher heat-releasing performance.

Figure 4:
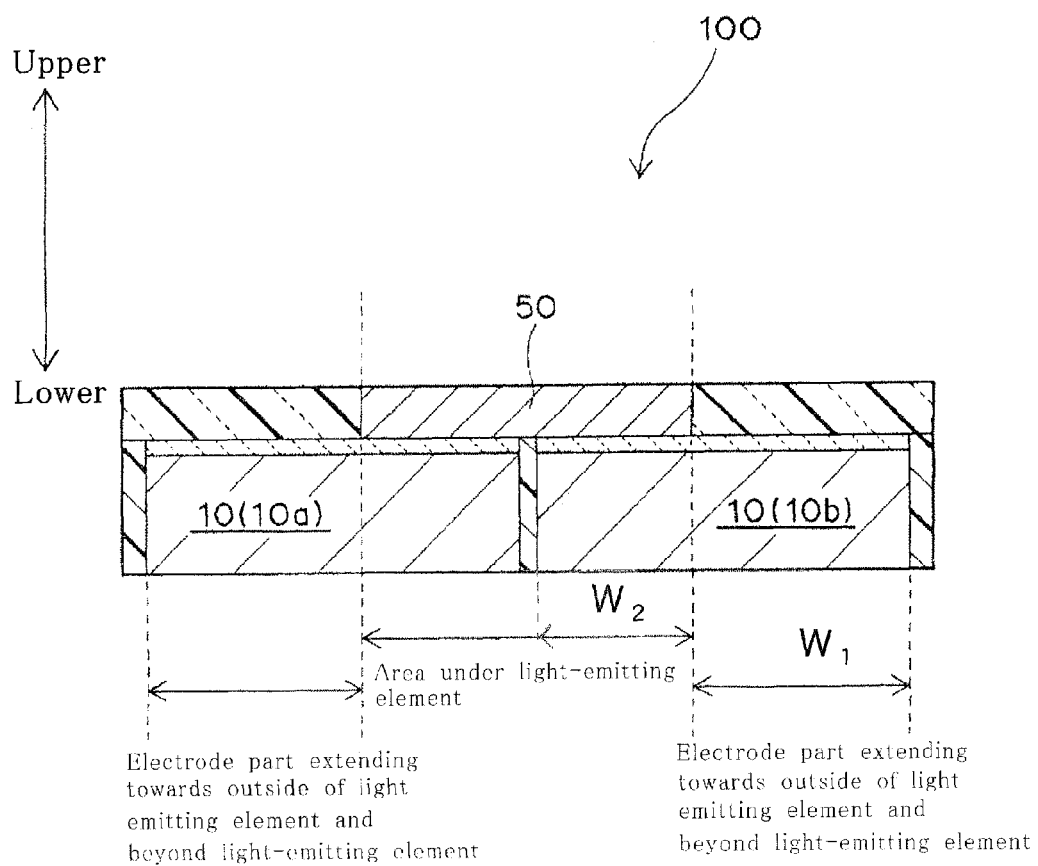
FIG. 4 is a schematic cross-sectional view for explaining an embodiment of the electrode part for light-emitting element according to the present invention wherein the electrode part laterally extends toward the outside of the light-emitting element so that the electrode part extends beyond the light-emitting element.

It is preferred that the light-emitting element electrode part 10 has a larger size in a width direction thereof in order to achieve the higher heat releasing performance and/or the higher supporting function in the device. In particular, it is preferred as shown in FIG. 4 that the light-emitting element electrode parts (10*a*, 10*b*) extend toward the outside of the light-emitting element 50 so that the light-emitting element electrode parts extend beyond the light-emitting element 50. In other words, it is preferred that each of the positive and negative electrode portions 10*a*, 10*b* of the light-emitting element electrode part 10 is not only located in a lower region of the light-emitting element 50 but also extends to an outer region of the lower region in a lateral direction/width direction of the device. In the light-emitting element electrode part 10 with the above preferred form, the supporting function for supporting the light-emitting element 50 is further improved in the device. Furthermore, the electrode part 10 extending in the lateral direction/width direction makes it possible to dissipate the heat from the light-emitting element 50 not only in the downward direction but also in the horizontal direction, which leads to a reduction of the heat resistance as a whole of the device. In the case where the light-emitting element electrode 10 extends to the outer region in the lateral direction/width direction, the reflective layer 30 positioned on the light-emitting element electrode 10 can also similarly extend to the outer region in the lateral direction/width direction. That is, the reflective layer 30 is not only located in a lower region of the light-emitting element 50 but also extends to the outer region of the lower region in the lateral direction/width direction of the device. In this regard, the downward light emitted from the light-emitting element can be reflected by the reflective layer more widely, and thereby achieving the more efficient extraction of the light. That is, the light-emitting element electrode part 10 and the reflective layers 30 extending to the outer region in the lateral direction/width direction makes it possible to provide the device with further improved performances of "heat releasing" and "light extraction".

If the light-emitting element electrode part unnecessarily extends to the outer region, the downsizing of the device may be inhibited. Therefore, the dimension of the portion of the light-emitting element electrode part, which portion extending to the outer region, may be appropriately determined in the consideration of the balancing of "supporting function/heat releasing performance", "downsizing" and "light extraction performance". By way of example, more than half of the width dimension of the light-emitting element electrode part may be positioned in the outer region beyond the light-emitting element. Taking an example of the light-emitting element electrode part shown in FIG. 4, "width W1 of the electrode portion positioned in the outer region" may be equal to or larger than "width W2 of the electrode portion positioned underneath the light-emitting element".

Figure 5A:
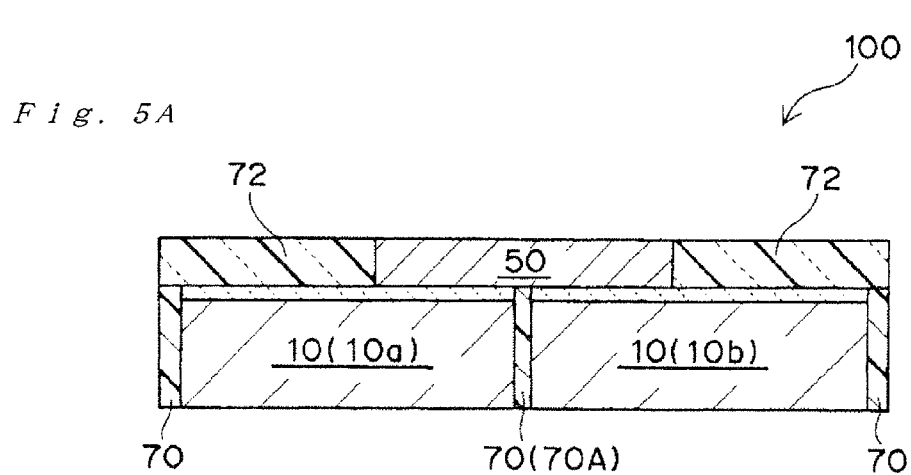
FIGS. 5A to 5C are schematic cross-sectional views for explaining "insulating part" according to the present invention.
Figure 5B:
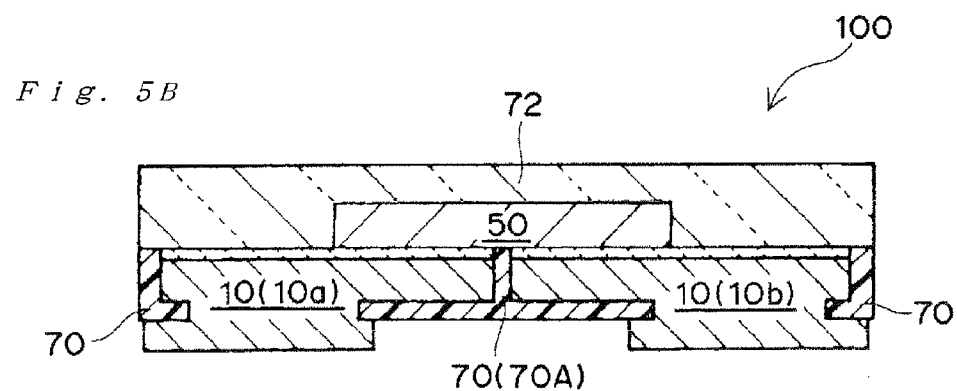
Figure 5C:
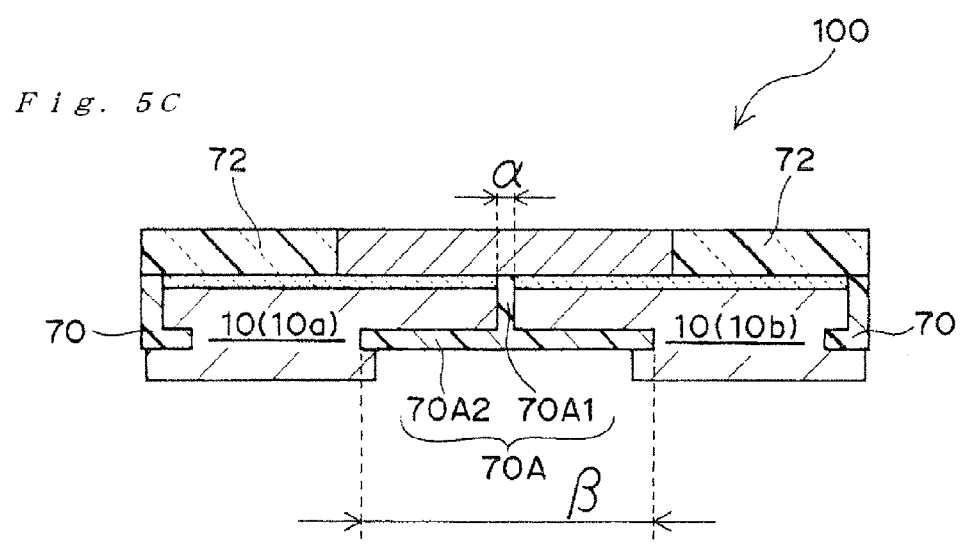

According to the present invention, an insulating part is preferably provided in the light-emitting device. Specifically, it is preferred as shown in FIGS. 5A-5C that a first insulating part 70 is provided around the light-emitting element electrode part 10, whereas a second insulating part 72 is provided around the light-emitting element 50. As seen from the illustration of FIGS. 5A-5C wherein the first insulating part 70 is provided, the light-emitting element electrode part 10 along with the first insulating part 70 serves as the supporting layer in the device. The first insulating part 70 is provided between the positive electrode portion 10a and the negative electrode portion 10b of the light-emitting element electrode part 10 to ensure an insulation between the positive and negative electrode portions 10a, 10b. On the other hand, as seen from the illustration of FIGS. 5A-5C, the second insulating part 72 can serve as a sealing layer/sealing part for protecting or isolating the light-emitting element 50 from the outside environment, as well as serve as the supporting layer (see FIG. 5B in particular).

Materials for the first insulating part 70 and the second insulating part 72 may be any suitable kinds of insulating materials. For example, the first insulating part 70 and the second insulating part 72a may be made of resin material. More specifically, the resin materials may be an epoxy-based resin or a silicone-based resin. It is preferred that the second insulating part 72 is made of a transparent resin in view of the light extraction. As such, the second insulating parts 72 may be preferably made of a transparent epoxy resin or a transparent silicone resin, for example. Furthermore, in view of light resistance and heat resistance, the material for the first and second insulating parts may be a hybrid material of organic material and/or inorganic material, or an inorganic material only, for example. For example, the material for the first insulating part 70 and the second insulating part 72 may be a sealing material of inorganic glass or the like.

As shown in FIGS. 5A and 5B, it is preferred that the first insulating part 70 is provided between the positive electrode portion 10a and the negative electrode portion 10b of the light-emitting element electrode part 10 and also in the periphery of the electrode part to be in contact with such electrode part. It is also preferred that the thickness of the first insulating part 70 may be approximately the same as the thickness of the electrode part 10. In a preferred embodiment, the first insulating part 70 may be provided such that the upper surface of the first insulating part is flush with the upper surface of the reflective layer 30 (see FIGS. 5A and 5B). It is also preferred as shown in FIGS. 5A and 5B that the second insulating part 72 is provided such that it surrounds the light-emitting element 50 in contact with the light-emitting element 50. The thickness of the second insulating part 72 may be approximately the same as the thickness of the light-emitting element 50. In a case where a phosphor layer 80 is provided separately as described later, the second insulating part 72 may be provided such that its upper surface is flush with the upper surface of the light-emitting element 50 (see FIG. 5A). In a case where the second insulating part 72 additionally serves as a phosphor layer (i.e., in a case where the second insulating part 72 is made of not only a resin material and/or an inorganic material but also a phosphor material), the second insulation part 72 can be thick enough to surround the light-emitting element 50 (see FIG. 5B).

The light-emitting device of the present invention can also be characterized by "fine insulating film". More specifically, "local first insulating part 70A" provided between the positive electrode portion 10a and the negative electrode portion 10b is composed of two portions of "narrower region 70A1" and "wider region 70A2", as shown in FIG. 5C. This makes it possible to prevent a short circuit between the positive electrode portion 10a and the negative electrode portion 10b, while rendering the thickness of the electrode part large, which can contribute to the achievement of high heat-releasing. That is, the occupied area by the light-emitting element electrode part is larger because of the "surface contact", which may trigger a short circuit due to the short distance between the positive electrode portion 10a and the negative electrode portion 10b. However, the wider region 70A2 according to the present invention can suitably prevents such short circuit in the device. That is, the wider region 70A2 of the first insulating part 70A serves to lengthen the distance between the positive electrode portion 10a and the negative electrode portion 10b, thereby preventing the short circuit. By way of example, the width dimension "α" (see FIG. 5C) of the narrower region 70A1 is in the approximate range of 20 μm to 70 μm, whereas the width dimension "β" (see FIG. 5C) of the wider region 70A2 may be 100 μm or larger. It should be note that the upper limit of the width dimension of the wider region may be, but is not necessarily limited to, about 500 μm.

Figure 6A:
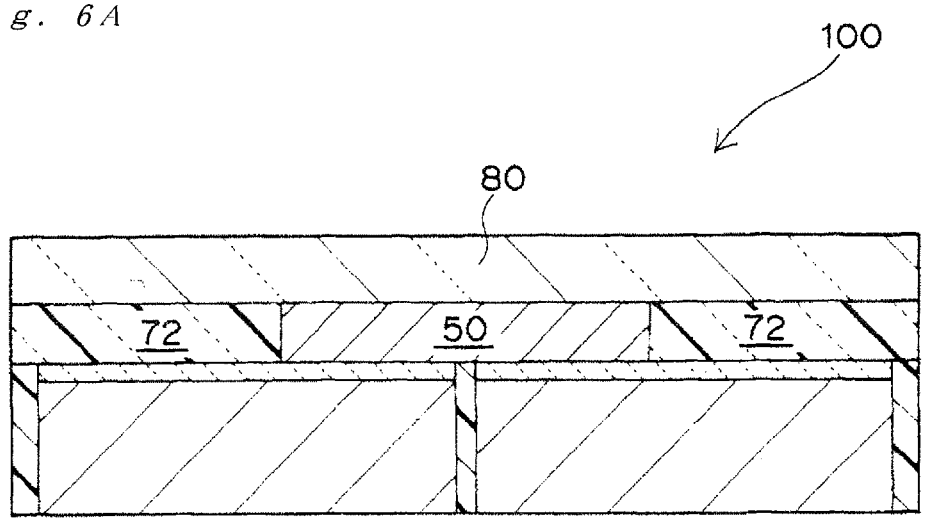
FIGS. 6A to 6B are schematic cross-sectional views for explaining "phosphor layer" provided in the device according to the present invention.
Figure 6B:
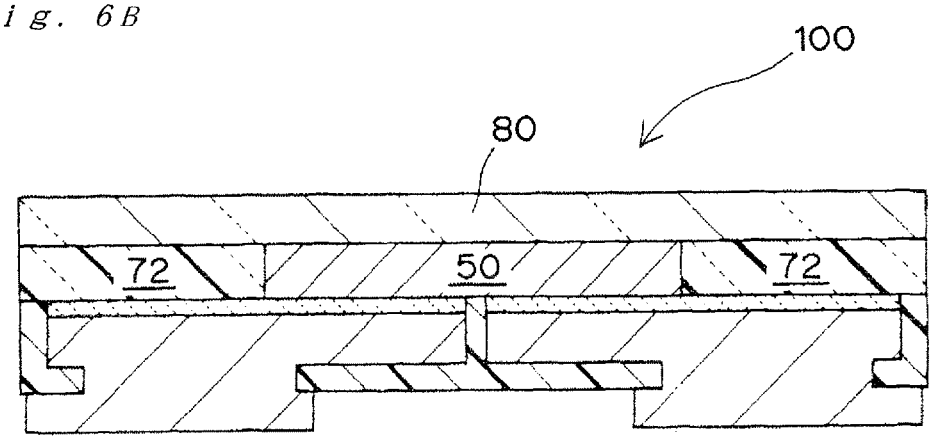

In the light-emitting device of the present invention, the phosphor layer may be provided as needed. For example, as shown in FIGS. 6A and 6B, the phosphor layer 80 may be provided on the second insulating part 72. More specifically, as illustrated in FIGS. 6A and 6B, the phosphor layer 80 may be provided on the second insulating part 72 such that the phosphor layer 80 covers the upper principal surface of the light-emitting element 50. The material for the phosphor layer 80 is not particularly limited as long as it can generate a desired light when receiving the light from the light-emitting element 50. That is, the kind of the phosphor in the phosphor layer 80 may be determined in view of light/electromagnetic-wave emitted from the light-emitting element 50. For example in a case where the light-emitting device is used as a white-light LED package for lighting application, a bright white light can be provided by the phosphor layer 80 with its phosphor material capable of producing yellow colors when receiving blue light emitted from the LED 50. Furthermore, in a case where the electromagnetic wave emitted from LED 50 is ultraviolet (UV), a phosphor material capable of directly producing a white light on receiving the UV may also be used. In a case where the second insulating part 72 is made of not only an insulating material (e.g., a resin material and/or an inorganic material) but also a phosphor material, the second insulating part 72 can have not only the sealing function for the light-emitting element, but also a fluorescent function serving as a fluorescent layer. This makes it unnecessary to provide the phosphor layer 80 separately in the device.

Figure 7A:
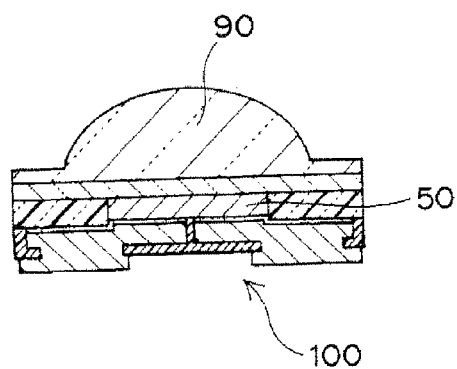
FIGS. 7A to 7B are schematic cross-sectional views for explaining "lens part" provided in the device according to the present invention.
Figure 7B:
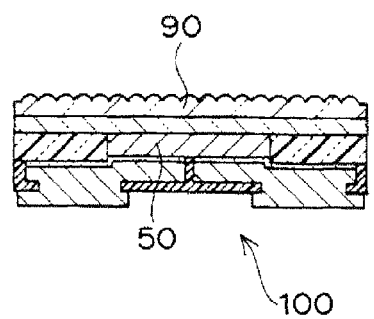

The light-emitting device 100 of the present invention can also be embodied as "device exhibiting light directivity" or "device exhibiting no light directivity". It is preferred that the device capable of exhibiting the light directivity comprises a lens part 90 as shown in FIGS. 7A and 7B, for example. As illustrated, a lens-shaped portion of the part 90 is not limited to "single" (as shown in FIG. 7A), but may be "multiple" (as shown in FIG. 7B). The second insulating part 72 and/or the phosphor layer 80 may have lens shape.

Figure 8A:
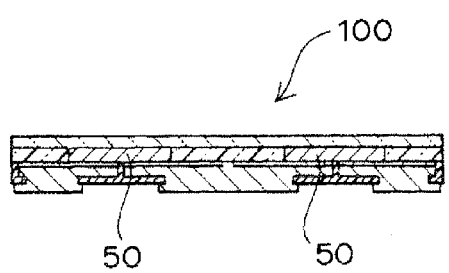
FIGS. 8A to 8B are schematic cross-sectional views for explaining "multi-chip" configuration according to the present invention.
Figure 8B:
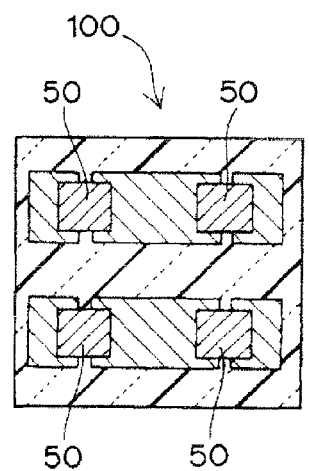

The light-emitting device 100 of the present invention may also be embodied not only as a "single-chip" device where the light-emitting element 50 is provided singly as shown in FIGS. 1-6, but also as a "multi-chip" device where a plurality of the light-emitting elements 50 are provided as shown in FIGS. 8A and 8B, for example. That is, the light-emitting device 100 according to "multi-chip" can be embodied with a plurality of chips arranged in a form of array.

The light-emitting device 100 of the present invention can also be embodied according to the following embodiments.

(Bended Form of Electrode Part/Reflecting Layer)

Figure 9A:
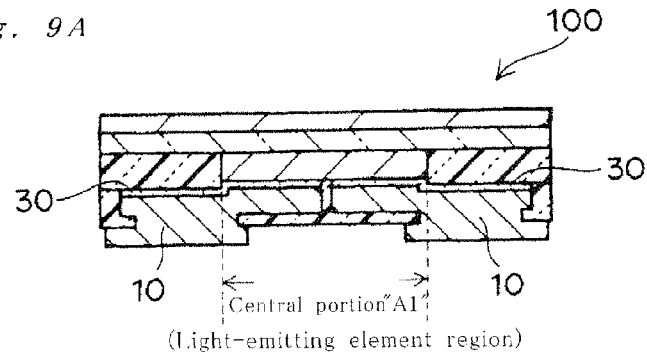
FIGS. 9A to 9D are schematic cross-sectional views for explaining "bended form of electrode part and reflective layer" according to the present invention.
Figure 9B:
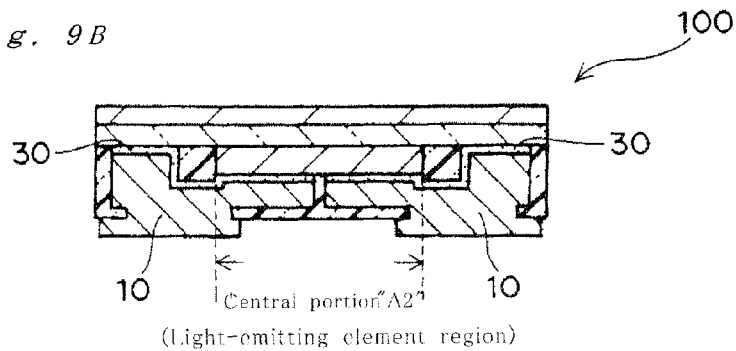
Figure 9C:
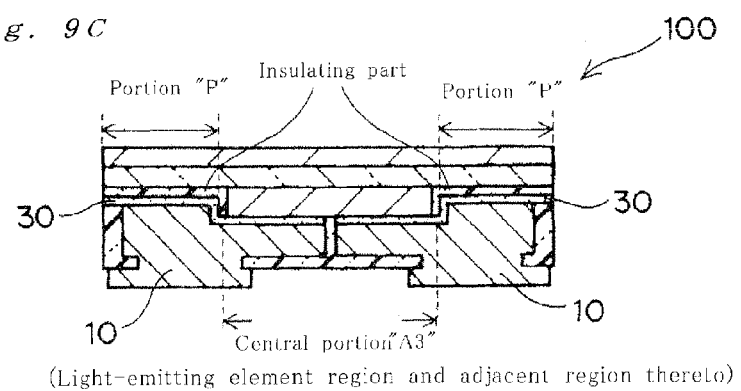

FIGS. 9A-9D show "bended form of electrode part/reflective layer". As illustrated, the electrode part 10 (in particularly, upper surfaces thereof) and reflective layer 30 respectively have a bended form. In FIG. 9A, the electrode part 10 and the reflective layer 30 are in such a bended form that a central portion "A1" thereof (i.e., light-emitting element region) is slightly raised. In FIG. 9B, the electrode part 10 and the reflective layer 30 are in such a bended form that most portions thereof are recessed while a central portion "A2" of the electrode part 10 and the reflective layer 30 (i.e., light-emitting element region) is slightly raised. From another viewpoint, the embodiment shown in FIG. 9B can be regarded as an embodiment where the thickness of the electrode part 10 positioned at the outer side of the device is increased. In FIG. 9C, the electrode part 10 and the reflective layer 30 are in a bended form that a central portion "A3" thereof (i.e., light-emitting element region and also its nearby region) is slightly recessed. The embodiment can also be regarded as an embodiment where the thickness of the electrode part positioned at the outer side of the device is increased. Moreover, an embodiment shown in FIG. 9D corresponds to an embodiment where the portions "P" of the insulating layer have been removed from the embodiment shown in FIG. 9C. Even in the embodiments as shown in FIGS. 9A-9D, the both performances of "heat releasing" and "light extraction" can be suitably achieved.

(Embodiment of Reflector Structure)

Figure 10:
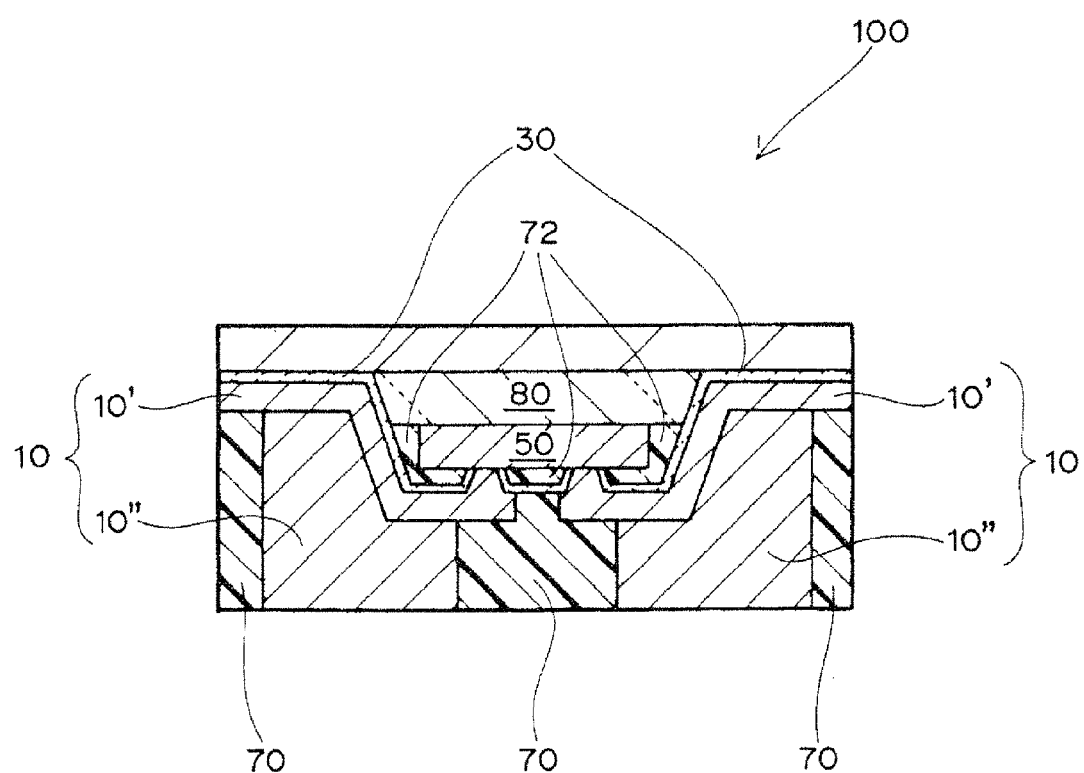
FIG. 10 is a schematic sectional view of the form/configuration of a reflector structure of the light-emitting device according to the present invention.

FIG. 10 illustrates the light-emitting device 100 having a reflector structure according to the present invention. The embodiment of the reflector structure may correspond to a modified embodiment of the bended form of the electrode part/reflective layer. According to the reflector structure, the electrode part 10 (in particular, a portion 10' of the electrode part) and the reflective layer 30 are in a bended form such that they are greatly recessed and the light-emitting element 50 is positioned in the recessed region. Even according to the reflector structure, the both performances of "heat releasing" and "light extraction" can be suitably achieved. In particular, the embodiment of "reflector" enables the reflective layer 30 around the light-emitting element 50 to serve to effectively reflect the light from the light-emitting element 50. In this regard, the reflective layer 30 is positioned at a higher level than that of the light-emitting surface, and thereby the light extraction performance can be particularly improved. Moreover, the light-emitting device with the reflector structure can provide advantageous effects such as "higher density (i.e., smaller device)", "higher thermal conductivity" and "more simplified manufacturing process".

[Method for Manufacturing Light-Emitting Device According to the Present Invention]

Figure 11A:
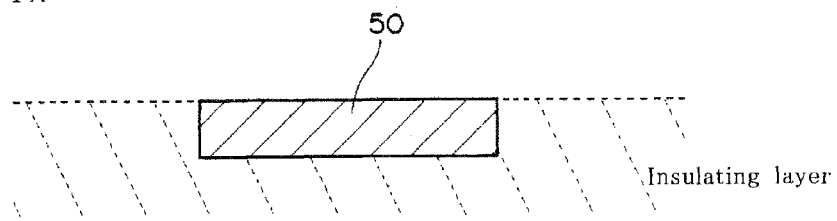
FIGS. 11A to 11D are process-cross sectional views schematically illustrating a manufacturing method according to the present invention.
Figure 11B:
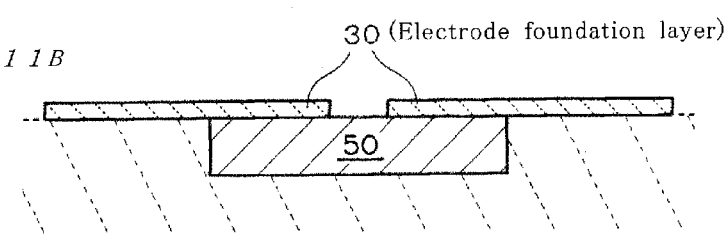
Figure 11C:
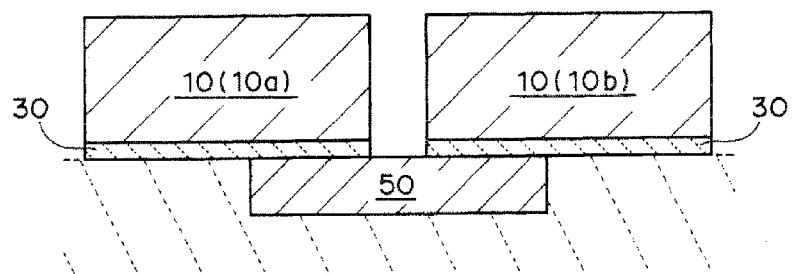
Figure 11D:
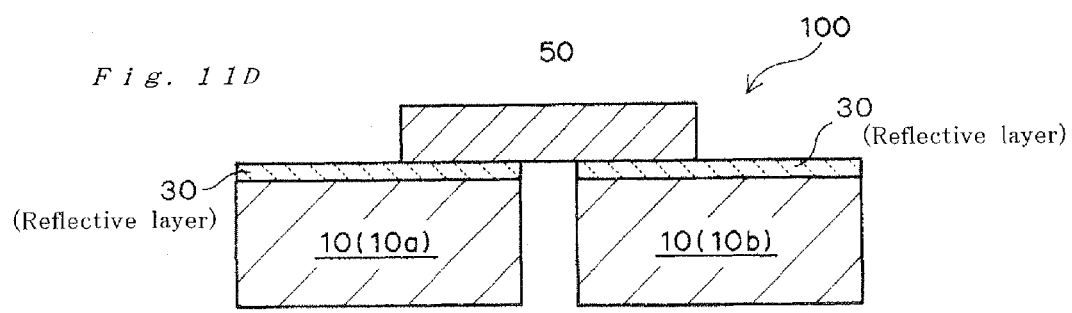

Next, a method for manufacturing the light-emitting device according to the present invention will be described. FIGS. 11A-11D schematically illustrate processes associated with the manufacturing method of the present invention. In the manufacturing method of the present invention, a step (i) is firstly carried out to provide the light-emitting element 50 as shown in FIG. 11A. It is preferred that the light-emitting element 50 is suitably provided for the following formations of the reflective layer and the electrode part. For example, "light-emitting element having an insulating layer at least on a principal surface of the light-emitting element" is provided as the light-emitting element 50 in the step (i). By way of example, the light-emitting element 50 is provided in a form of being in an embedded state in the insulating layer, as shown in FIG. 11A. Then, a step (ii) is carried out to form the light-emitting element electrode part 10 on the light-emitting element 50. Specifically, the light-emitting element 50 is subjected to a direct metallization process (for example, a Cu direct metallization process). In the step (ii), the foundation layer for the formation of the electrode part for light-emitting element is formed on the light-emitting element 50 as shown in FIG. 11B. In particular, the foundation layer is formed such that it covers a portion of the principal surface of the light-emitting element. Thereafter, the light-emitting element electrode part 10 is formed to make surface contact with the light-emitting element 50 via the foundation layers 30 as shown in FIG. 11C. The foundation layer 30 used for the formation of the electrode part is eventually used as the reflective layer 30 of the light-emitting device 100 as shown in FIG. 11D.

The processes in the manufacturing method of the present invention are relatively simple in that the electrode part is directly formed on the light-emitting element and the foundation layer for such direct formation is eventually used as the reflective layer of the light-emitting device. By such simple processes, there can be obtained the light-emitting device capable of satisfying the both performances of the heat releasing and the light extraction. In particular, when focusing on the manufacturing processes, the light-emitting element electrode part 10 can be formed with being thick and having good adhesion due to the presence of the electrode foundation layer 30.

It is preferred that the foundation layer 30 is formed by a dry plating process whereas the light-emitting element electrode part 10 is formed by a wet plating process. As such, it is preferred that the foundation layer 30 is provided as a dry plating layer whereas the light-emitting element electrode part 10 is provided as a wet plating layer. Examples of the dry plating process include a vacuum plating process (Physical Vapor Deposition, i.e., PVD process) and a chemical vapor plating process (Chemical Vapor Deposition, i.e., CVD process). Examples of the vacuum plating process include a vacuum deposition process, a sputtering process, and an ion plating process. On the other hand, examples of the wet plating process include an electroplating process, a chemical plating process, and a hot-dip plating process. In a preferred embodiment, the foundation layer 30 is formed by the sputtering process, and then the light-emitting element electrode part 10 is formed by the electroplating process (e.g., an electrolytic plating process) in the manufacturing method of the present invention. By way of example, the foundation layer 30 is not limited to a single layer but may be formed as a form of multiple layers. For example, a Ti thin film layer and a Cu thin film layer may be formed as the foundation layer 30 by the sputtering process. More specifically, the formation of the Ti thin film layer is performed, followed by the formation of the Cu thin film layer, the both formations being performed by the sputtering process. On such sputtering layers having the two-layers structure, it is preferable to form the light-emitting element electrode part 10 by a Cu electrolytic plating process.

The manufacturing method of the present invention can be performed in various process embodiments, which will be now described below.

Process Embodiment 1

Figure 13:
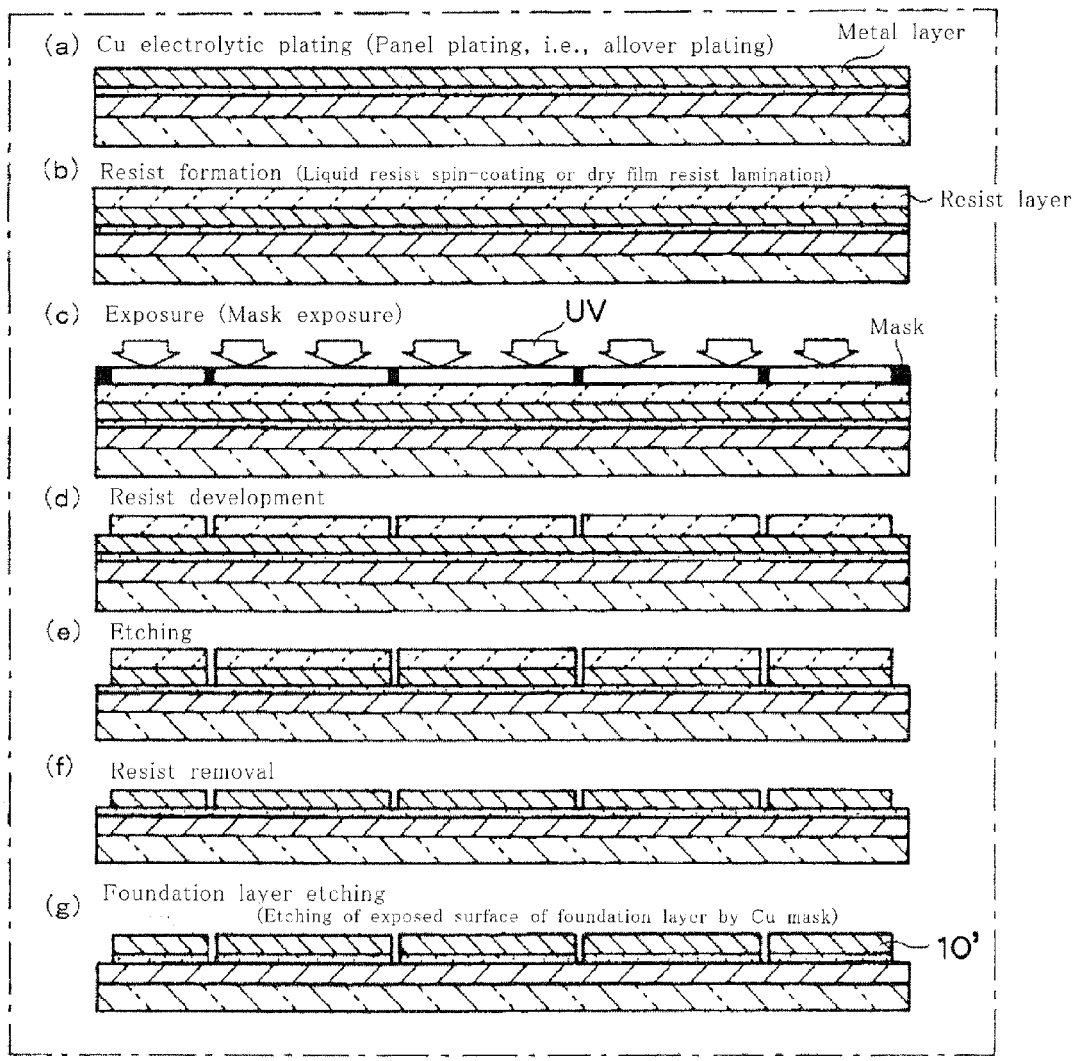
FIGS. 13(a) to 13(g) are process-cross sectional views schematically illustrating such an embodiment that a patterning of a sub-electrode part is performed by "Patterning process by etching after plating".
Figure 14:
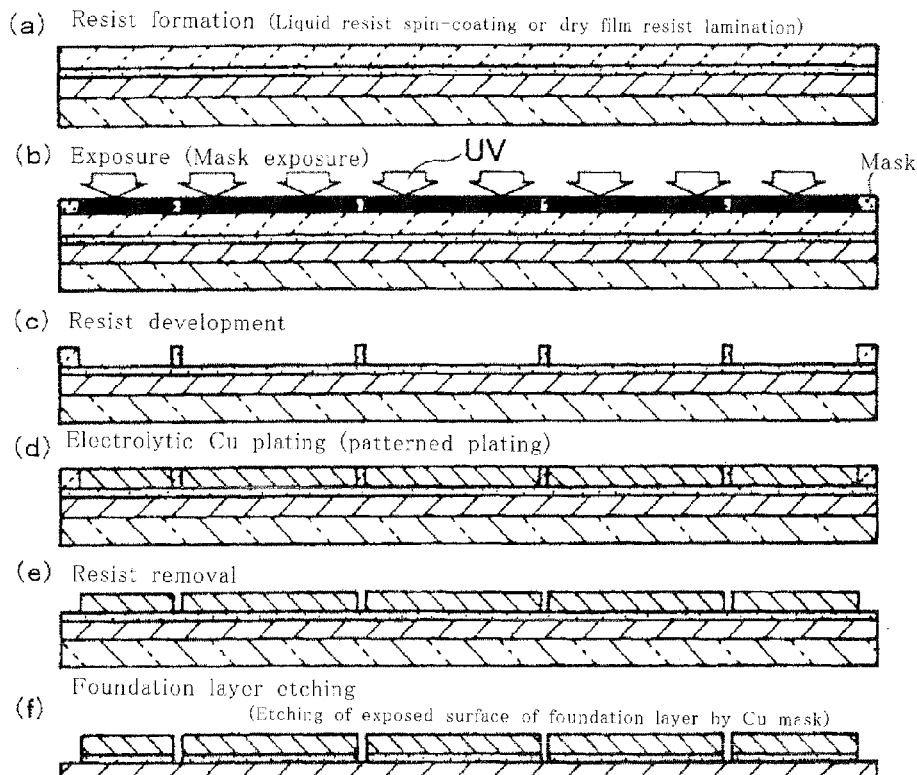
FIGS. 14(a) to 14(f) are process-cross sectional views schematically illustrating such an embodiment that a patterning of a sub-electrode part is performed by "Patterned plating process after formation of resist pattern".

FIGS. 12A-12G illustrate schematic sectional views of the processes according to "Process Embodiment 1". This embodiment corresponds to the processes for carrying out the manufacturing of the light-emitting device, based on a LED wafer. Firstly, as shown in FIGS. 12A and 12B, a sealing layer 72' is formed on a principal surface of a LED wafer 50'. The sealing layer 72' may be formed by applying a raw material onto the principal surface of the LED wafer by a doctor blade process or a spin coating process, followed by a heat treatment thereof. Alternatively, the sealing layer 72' may also be formed by superimposing a sealing film onto the LED wafer. Then, as shown in FIG. 12C, electrode foundation layer 30 is formed, for example, by a dry plating process (e.g., sputtering process). Then, as shown in FIG. 12D, a sub-electrode part pattern 10' is formed directly on the LED wafer 50 via the electrode foundation layer 30. The formation of the sub-electrode part pattern 10' may be performed by "Patterning by etching after plating" as shown in FIGS. 13(*a*)-13(*g*). Specifically, as illustrated, a metal layer (e.g., Cu layer) is formed on the entire surface of the electrode foundation layer by an electroplating process (e.g., Cu electroplating process), and thereafter a resist layer is formed by a liquid resist spin-coating process or a dry film resist lamination process, etc. Then, mask exposure (i.e., exposure via mask) and development treatments are performed. Thereafter, a resist development treatment, and an etching treatment of the metal layer are performed, followed by the removal of the resist layer. Finally, the electrode foundation layer is subjected to an etching treatment by using the metal pattern as a mask. Alternatively, as shown in FIGS. 14(*a*)-14(*f*), the sub-electrode pattern 10' may be formed by "Patterned plating after formation of resist pattern". Specifically, as illustrated, a resist layer is formed by a liquid resist spin-coating process or a dry film resist lamination process. Thereafter, mask exposure and resist development treatments are performed. Then, patterned plating process (e.g., electrolytic Cu pattern plating process) is performed. Thereafter, the resist layer is removed, and finally the electrode foundation layer is subjected to an etching treatment by using the metal pattern as a mask.

Subsequent to the formation of the sub-electrode pattern 10', an insulating layer pattern is formed as shown in FIG. 12E. As illustrated, the insulating layer pattern 70' is preferably formed such that the insulating layer pattern 70' bridges two neighboring sub-electrode parts 10', filling the space between the two neighboring sub-electrode parts 10'. In a case where the raw material for the insulating layer is a photosensitive material, the material may be applied allover by a spin coating process or a doctor blade process, or the material may be provided by superimposing the insulating layer film, and thereafter the mask exposure and development treatment may be performed to form the insulating layer pattern 70' (see FIGS. 15A(*a*)-15A(*c*)). In this regard, the photosensitivity of the material may be either a positive type or a negative type. While on the other hand, in a case where the raw material for the insulating layer is not the photosensitive material, the insulating layer pattern 70' may be formed by printing the pattern directly by a printing process (see FIG. 15B).

Subsequent to the formation of the insulating layer pattern 70', the sub-electrode part pattern 10" is formed such that the sub-electrode part pattern 10" is integrally jointed to the sub-electrode part pattern 10' (see FIG. 12F). The formation of the sub-electrode part pattern 10" can be performed by "Patterning by etching after plating" or "Patterned plating after formation of resist pattern" as described above.

As such, the formation of the light-emitting element electrode part 10 includes two phases to form the first sub-electrode part 10' and to form the second sub-electrode part 10", in which case the formation of the insulating layer 70' is conducted at a point in time between the formation of the first sub-electrode part 10' and the formation of the second sub-electrode part 10" (FIGS. 12D-12F). These processes make it possible to form "local region of insulating part" located between the positive electrode portion and the negative electrode portion of LED, such local region being preferably composed of two portions of "narrower region" and "wider region" (see FIG. 12F). As for the two-phased formation of the electrode part 10, the thickness of the first sub-electrode part 10' to be formed initially may be greater than the thickness of the second sub-electrode part 10" to be formed thereafter.

Finally, as shown in FIG. 12G, a cutting operation is conducted to divide the sealing layer 72' and the LED wafer 50' per unit which includes two electrode parts 10 each including the first sub-electrode part 10' and the second sub-electrode part 10'. There can be finally obtained the light-emitting device 100 as shown at the bottom of FIG. 12. In the light-emitting device 100, the electrode foundation layer 30 is utilized as the reflective layer. Furthermore, in the case of the manufacturing of the device using the LED wafer as described above, the individual electrode part can protrude beyond the LEDs so that it extends toward the outside of the LEDs due to the fact that the cutting operation as shown in FIG. 12G is performed. According to the above-mentioned processes, various elements can be formed on the LED wafer so that the clean surface (i.e., flat surface) of the wafer is used as a starting site of the formation, which can promote an achievement of the preferable processes.

Process Embodiment 2

FIGS. 16A-16H illustrate schematic sectional views of the processes according to "Process Embodiment 2". This embodiment corresponds to the processes for carrying out the manufacturing of the light-emitting device, based on LED chips. Firstly, as shown in FIG. 16A, a plurality of LED chips 50 are disposed on a carrier film 85 with being spaced away from each other. Then, as shown in FIG. 16B, a sealing layer 72' (in particular, a light-permeability sealing layer) is formed on the carrier film 85, and thereby the LED chips 50 are covered with the sealing layer. Subsequent to the formation of the sealing layer 72', the career film 85 is removed, and thereby obtaining the LED chips 50 buried in the sealing layer 72' as shown in FIG. 16C. That is, there can be provided the light-emitting elements with the sealing layer being located at least on the principal surfaces of the light-emitting elements. In particular, the light-emitting elements 50 buried in the sealing layer 72' is provided, the light-emitting elements 50 being flush with the sealing layer 72'.

Thereafter, as shown in FIG. 16D, the electrode foundation layer 30 is formed by a dry plating process (e.g., sputtering process). Because of the "flush with", the foundation layer 30 as sputtering layer can be suitably formed uniformly at a constant thickness. Then, as shown in FIG. 16E, a sub-electrode part pattern 10' is formed directly on the LED chips 50 via the electrode foundation layer 30. The formation of the sub-electrode part pattern 10' can be performed by "Patterning by etching after plating" or "Patterned plating after formation of resist pattern" as described above with respect to "Process Embodiment 1". Subsequent to the formation of the sub-electrode part pattern 10', an insulating layer pattern 70' is formed as shown in FIG. 16F. As illustrated, the insulating layer 70' is preferably formed such that it bridges two neighboring sub-electrode parts 10', filling the space between the two neighboring electrode parts 10'. The formation of the insulating layer pattern 70' can be performed in the same manner as described above with respect to "Process Embodiment 1" (see FIGS. 15A(a)-15A(c) or FIG. 15B). Subsequent to the formation of the insulating layer pattern 70', as shown in FIG. 16G, a second sub-electrode part pattern 10" is formed to integrally join the sub-electrode part pattern 10'. The formation of the second sub-electrode part pattern 10" can be performed by "Patterning by etching after plating" or "Patterned plating after formation of resist pattern" as described above.

Even in the case of "Process Embodiment 2", the formation of the light-emitting element electrode part includes two phases to form the first sub-electrode part 10' and to form the second sub-electrode part 10", in which case the formation of the insulating layer is conducted at a point in time between "formation of the first sub-electrode parts 10'" and "formation of the second sub-electrode parts 10"" (see FIGS. 16E-16G). These processes make it possible to form "local region of insulating part" located between the positive electrode portion and the negative electrode portion of LED, such local region being preferably composed of two portions of "narrower region" and "wider region" (see FIG. 16G). As illustrated, according to "Process Embodiment 2", each of the electrode parts 10 composed of the first sub-electrode part 10' and the second sub-electrode part 10" is formed preferably such that the electrode part extends toward the outside of the LED chip 50, and thereby the electrode part protrudes beyond the LED chip 50.

As shown in FIG. 16H, a cutting operation is finally conducted per unit of the chip to divide the LED chips 50 into the separate chips. As a result, there can be obtained the light-emitting device 100 as shown at the bottom of FIG. 16. The electrode foundation layer 30 is used as the reflective layer in the light-emitting device 100.

Process Embodiment 3

FIGS. 17A-17G illustrate schematic sectional views of the processes according to "Process Embodiment 3". This embodiment corresponds to a modification of "Process Embodiment 2". Firstly, as shown in FIG. 17A, a plurality of LED chips 50 are disposed on a carrier film 85 with being spaced away from each other. Then, an insulating film 72' (e.g., insulating film made of inorganic material) is formed between the neighboring LED chips 50. As illustrated, the insulating film 72' is preferably formed such that it is flush with the LED chips 50. The patterning of the insulating layer 72' can be performed in the above-described manner with respect to "Process Embodiment 1" (see FIGS. 15A(a)-15A(c) or 15B). Subsequent to the patterning of the insulating layer 72', a phosphor layer 80 is formed on the LED chips 50 and the insulating layer pattern 72' (see FIG. 17B), and thereafter the carrier film 85 is removed. As a result, there can be provided the light-emitting elements 50 as shown in FIG. 17C.

Then, similarly to "Process Embodiment 2", an electrode foundation layer 30, a sub-electrode part pattern 10', an insulating layer 70', and a second sub-electrode part pattern 10" are sequentially formed, followed by the cutting operation thereof (see FIGS. 17D through 17G). As a result, there can be obtained the light-emitting device 100 as shown at the bottom of FIG. 17. Instead of "formation of the insulating film 72' between the neighboring LED chips 50", an insulating layer including phosphor component can be formed on the carrier film 85 to cover the LED chips 50. In this case, there can be obtained the light-emitting device 100 as shown at the right bottom in FIG. 17. That is, there can be obtained the "light-emitting device where the second insulating part comprises a phosphor component" described in the above [Light emitting devices of the present invention].

Process Embodiment 4

FIGS. 18A-18G illustrate schematic sectional views of the processes according to "Process Embodiment 4". This embodiment also corresponds to a modification of "Process Embodiment 2". Firstly, a phosphor layer 80 is formed on a carrier film 85, and thereafter a plurality of LED chips 50 are disposed on the phosphor layer 80 with being spaced away from each other (see FIG. 18A). Then, as shown in FIG. 18B, an insulating layer 72' (in particular, photosensitive material layers) is formed on the phosphor layer 80 to cover the LED chips 50. Subsequently, as shown in FIG. 18C, the insulating layer 72' is subjected to a patterning treatment. As illustrated, the patterning treatment is preferably performed so that a part of the insulating layers 72' is left, the part being positioned between the neighboring LED chips 50. Such patterning treatment may be performed in the same manner as described above with respect to "Process Embodiment 1" (see FIGS. 15A(a)-15A(c)).

Figure 9D:
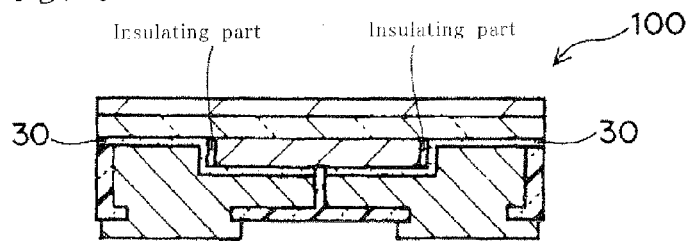
Figure 19:
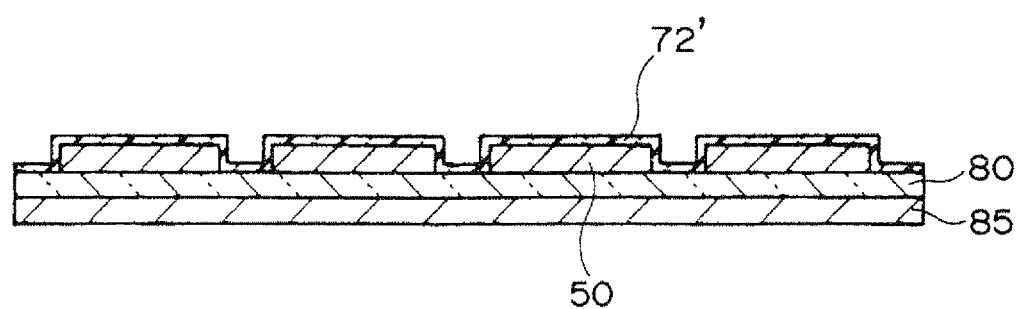
FIG. 19 is a schematic cross-sectional view for explaining a modified embodiment of an insulating layer and a patterning process thereof.

Then, similarly to "Process Embodiment 2", an electrode foundation layer 30, a sub-electrode part pattern 10', an insulating layer 70', and a second sub-electrode part pattern 10" are sequentially formed, followed by the cutting operation thereof (see FIGS. 18D through 18G). As a result, there can be obtained the light-emitting device 100 as shown at the bottom of FIG. 18. In this process embodiment, the phosphor layer is formed by an application process or a superimposing process with respect to the surface of the career film. Thus, the phosphor layer can be provided preferably in a form of "plane", which is different from that of the conventional LED package where the phosphor layer is generally provided after the singulation process. In this "Process Embodiment 4", the carrier film 85 is eventually maintained as being not removed but used as a component/part of the light-emitting device. In this regard, for example as shown in FIGS. 7A and 7B, the carrier film 85 can be used as a lens part. Furthermore, in this "Process Embodiment 4", the formation of the insulating layer 72' or the patterning treatment thereof may be suitably adjusted (for example, see FIG. 19) to provide the light-emitting devices as shown in FIGS. 9C and 9D described in the above [Light emitting devices of the present invention].

Process Embodiment 5

FIGS. 20A-20G illustrate schematic sectional views of the processes according to "Process Embodiment 5". This embodiment corresponds to a manufacturing process embodiment of the light-emitting device 100 having the reflector structure. Firstly, a plurality of sub-phosphor layers 80' are formed on a career film 85, and one light-emitting element chip 50 is disposed on each of the sub-phosphor layers 80' (see FIG. 20A). Then, as shown in FIG. 20B, the raw material for insulating layer is applied allover by the spin coating process or the doctor blade process to form the insulating layer. Alternatively, the insulating layer film may be superimposed on the carrier film. Subsequent to the formation of the insulating layer, a patterning treatment thereof is performed to form local insulating layers 72' which partially expose a part of the surface of each of the light-emitting element chips 50 (see FIG. 20C). Subsequently, electrode foundation layer 30 is formed, and thereafter two first sub-electrode parts 10' are formed on each of the light-emitting element chips (see FIG. 20D). As for the "reflector", the foundation layer 30 and the first sub-electrode parts 10' have bended forms along the outline of a precursors 100' of the light-emitting device, the precursors 100' being composed of the sub-phosphor layers 80', the light-emitting element chips 50 and the local insulating layers 72' all of which are provided on the carrier film 85 (see FIG. 20D).

Subsequently, an insulating part 70' is formed such that it bridges at least two first sub-electrode parts 10', as shown in FIG. 20E. Similar to the formation of the insulating layers 72', a patterning treatment performed after the allover application of the insulating material or the superimposing of the insulating film can result in a pattern of the insulating parts 70'. Thereafter, as shown in FIG. 20F, second sub-electrode parts 10" are formed to be in contact with the first sub-electrode parts 10'. Finally, a cutting operation is performed per unit of chip to divide the light-emitting element chips 50 into the separate chips as shown in FIG. 20G. As a result, there can be obtained the light-emitting device 100 having the reflector structure as shown at the bottom of FIG. 20.

It should be noted that the present invention as described above includes the following aspects:

The first aspect: A light-emitting device comprising a light-emitting element comprising:
an electrode part for the light-emitting element;
a reflective layer provided on the electrode part; and
the light-emitting element provided on the reflective layer such that the light-emitting element is in contact with at least a part of the reflective layer,
wherein the light-emitting element and the electrode part are in an electrical connection with each other by mutual surface contact of the light-emitting element and the electrode part via the at least a part of the reflective layer,
wherein the electrode part serves as a supporting layer for supporting the light-emitting element, and
wherein the electrode part (and also the reflective layer provided thereon) extends toward the outside of the light-emitting element such that the electrode part (and also the reflective layer provided thereon) protrudes beyond the light-emitting element.

The second aspect: The light-emitting device according to the first aspect, wherein the electrode part is provided as a wet plating layer, and the reflective layer is provided as a dry plating layer.

The third aspect: The light-emitting device according to the first or second aspect, wherein the electrode part has a larger thickness than that of the light-emitting element.

The fourth aspect: The light-emitting device according to the first to third aspects, wherein the light-emitting device further comprises a first insulating part provided around the electrode part and a second insulating part provided around the light-emitting element.

The fifth aspect: The light-emitting device according to the fourth aspect, wherein the electrode part and the first insulating part serve as the supporting layer. In the light-emitting device according to the fifth aspect, the electrode part for the light-emitting element along with the first insulating part, if any, serves as the supporting layer.

The sixth aspect: The light-emitting device according to the fourth or fifth aspect, wherein the second insulating part serves as a sealing layer for sealing the light-emitting element. In the light-emitting device according to the sixth aspect, the second insulating part, if any, preferably serves as the sealing layer. For example, the second insulating part may comprise a resin component and/or inorganic material component, serving as the sealing layer for the light-emitting element.

The seventh aspect: The light-emitting device according to any one of the fourth to sixth aspects, wherein the second insulating part has a light permeability.

The eighth aspect: The light-emitting device according to any one of the fourth to seventh aspects, wherein the light-emitting device further comprises a phosphor layer provided on the second insulating part. In the light-emitting device according to the eighth aspect, the phosphor layer is located on the second insulating part, by way of example.

The ninth aspect: The light-emitting device according to any one of the fourth to seventh aspects, wherein the second insulating part comprises a phosphor component such that the second insulating part serves as both of a sealing layer and a phosphor layer. In the light-emitting device according to the ninth aspect, it is preferred that the second insulating part functions as not only the sealing layer but also the phosphor layer. For example, the second insulating part may comprise not only a resin component and/or inorganic material component, but also a phosphor component, and thereby functioning as not only the sealing layer but also the phosphor layer.

The tenth aspect: The light-emitting device according to any one of the fourth to ninth aspects, wherein the electrode part is composed of a positive electrode portion and a negative electrode portion, and
wherein the first insulating part is provided at least between the positive electrode portion and the negative electrode portion.

The eleventh aspect: The light-emitting device according to the tenth aspect, wherein a local region of the first insulating part is composed of two portions of a narrower region and a wider region, the local region being located between the positive electrode portion and the negative electrode portion.

The twelfth aspect: The light-emitting device according to any one of the first to eleventh aspects, wherein the reflective layer and a part of the electrode part have a bended form, and wherein the light-emitting element is positioned in a recess defined by the bended form. The light-emitting device according to the twelfth aspect has a so-called "reflector structure".

The thirteenth aspect: A light-emitting device comprising a light-emitting element comprising:
an electrode part for the light-emitting element;
a reflective layer provided on the electrode part; and
the light-emitting element provided on the reflective layer such that the light-emitting element is in contact with at least a part of the reflective layer,
wherein the light-emitting element and the electrode part are in electrical connection with each other by mutual surface contact via the at least a part of the reflective layer, and
wherein the electrode part serves as a supporting layer for supporting the light-emitting element.

The fourteenth aspect: A method for manufacturing a light-emitting device comprising a light-emitting element, the method comprising:
(i) providing the light-emitting element; and
(ii) forming an electrode part on the light-emitting element, the electrode part being for the light-emitting element,
wherein, in the step (ii), a foundation layer for the formation of the electrode part is formed on the light-emitting element, and thereafter the electrode part is formed such that the electrode part makes surface contact with the light-emitting element via the foundation layer, and
wherein the foundation layer is eventually used as a reflective layer of the light-emitting device.

The fifteenth aspect: The method according to the fourteenth aspect, wherein the foundation layer is formed by a dry plating process and the electrode part is formed by a wet plating process.

The sixteenth aspect: The method according to the fifteenth aspect, wherein a sputtering is conducted as the dry plating process and an electroplating is conducted as the wet plating process.

The seventeenth aspect: The method according to any one of the fourteenth to sixteenth aspects, wherein the light-emitting element provided in the step (i) is provided in combination of the insulating layer. For example, the light-emitting element of the step (i) is provided as one having an insulating layer at least on a principal surface thereof.

The eighteenth aspect: The method according to the seventeenth aspect, wherein a light-permeability insulating layer is used as the insulating layer.

The nineteenth aspect: The method according to the seventeenth or eighteenth aspect, wherein the light-emitting element has a form of a light-emitting element chip, and
wherein, in the step (i), the light-emitting element chip is disposed on a carrier film, and the insulating layer is formed on the carrier film to cover the light-emitting element chip and thereafter the carrier film is removed, and thereby the light-emitting element chip buried in the insulating layer is provided, the buried chip being flush with the insulating layer. In the method of the present invention according to the nineteenth aspect, the light-emitting element has a form of "chip", in which case the chip of the light-emitting element buried in the insulating layer is used, the chip being flush with the insulating layer.

The twentieth aspect: The method according to the nineteenth aspect, further comprising the step of forming a phosphor layer after the formation of the insulating layer and before the removal of the carrier film,
wherein, in the step (i), a plurality of the light-emitting element chips are disposed on the carrier film, and the insulating layer which is flush with the light-emitting element chips is formed such that a space between the neighboring light-emitting element chips is filled with the insulating layer, and thereafter the phosphor layer is formed on a plane defined by the light-emitting element chips and the insulating layer.

The twenty-first aspect: The method according to any one of the fourteenth to sixteenth aspects, wherein, in the step (i), the light-emitting element has a form of a light-emitting element chip, and
wherein, in the step (ii), the electrode part is formed such that the electrode part extends toward the outside of the light-emitting element chip in a lateral direction (i.e., in a direction perpendicular to the thickness direction of the light-emitting element) and thereby a part of the electrode part is beyond the light-emitting element chip. It is preferred in the method of the present invention that the form of the electrode part or process for the electrode part is approached by the aspect according to the twenty-first aspect or the twenty-second aspect as described below.

The twenty-second aspect: The method according to any one of the fourteenth to eighteenth aspects, wherein the light-emitting element provided in the step (i) has a form of a light-emitting element wafer, and
wherein, in the step (ii), a plurality of the electrode parts are formed on the light-emitting element wafer, and
wherein a cutting operation is conducted in the final stage of the manufacturing of the device to divide at least one of the plurality of the electrode parts into two pieces. Such cutting operation can eventually provide such an electrode part that extends toward the outside of the light-emitting element chip and thereby a part of the electrode part is beyond the light-emitting element chip.

The twenty-third aspect: The method according to any one of the fourteenth to twenty-second aspects, further comprising the step of forming an insulating part around the electrode part,
wherein the formation of the electrode part includes two phases to form a first sub-electrode part and to form a second sub-electrode part, and the formation of the insulating part is conducted at a point in time between the formation of the first sub-electrode part and the formation of the second sub-electrode part.

The twenty-fourth aspect: The method according to the twenty-third aspect, wherein a plurality of the electrode parts are formed in the step (ii), and
wherein the insulating part is formed such that the insulating part bridges two neighboring electrode parts. In particular, the insulating part is formed such that the insulating part bridges two neighboring electrode parts, thereby filling a space between the two neighboring electrode parts.

The twenty-fifth aspect: The method according to the seventeenth or eighteenth aspect, wherein the light-emitting element has a form of a light-emitting element chip, and
wherein, in the step (i), the light-emitting element chip is disposed on a phosphor layer formed on the carrier film, and thereafter an insulating layer is formed on the phosphor layer to cover the light-emitting element chip, and
wherein the carrier film is eventually not removed but used as a lens part of the light-emitting device.
In the method of the present invention according to the twenty-fifth aspect, the carrier film can be used as a constituent element of the light-emitting device.

The twenty-sixth aspect: The method according to the twenty-fifth aspect, wherein a plurality of the light-emitting element chips are provided, and wherein exposure and development treatments are conducted with respect to the insulating layer having a photosensitivity (e.g., the insulating layer serving as a photo sensitive resin layer) to perform a patterning treatment for leaving the insulating layer at least in a part of a space between the neighboring light-emitting element chips. It is preferred in the method of the present invention that the insulating layer is subjected to a suitable patterning treatment.

The twenty-seventh aspect: The method according to any one of the fourteenth to eighteenth aspects, wherein the light-emitting element has a form of a plurality of light-emitting element chips, and wherein, in the step (i), a plurality of sub-phosphor layers are formed on the carrier film and then each of the light-emitting element chips is disposed on each of the sub-phosphor layers. The method of the present invention according to the twenty-seventh aspect corresponds to a manufacturing method of the light-emitting device having a so-called "reflector structure".

The twenty-eighth aspect: The method according to the twenty-seventh aspect, wherein the formation of the electrode part includes two phases to form a first sub-electrode part and to form a second sub-electrode part, wherein a local insulating layer is formed on each of the light-emitting element chips such that a surface of the each of the light-emitting element chips is partially exposed, and thereafter the foundation layer is formed to cover the local insulating layer, and then two of the first sub-electrode parts are formed for each of the light-emitting element chips, and thereafter an insulating part is formed such that the insulating part bridges the two of the first sub-electrode parts, and then the second sub-electrode part is formed such that the second sub-electrode part makes contact with each of the first sub-electrode parts, and then a cutting operation is conducted per unit of the chip to divide the light-emitting element chips into the separate chips. The method of the present invention according to the twenty-eighth aspect also corresponds to a manufacturing method of the light-emitting device having a so-called "reflector structure".

The twenty-ninth aspect: The method according to the twenty-eighth aspect, wherein the foundation layer and the first sub-electrode part are formed such that the foundation layer and the first sub-electrode part have a bended form along an outline of precursor of the light-emitting device, the precursor being composed of the sub-phosphor layers, the light-emitting element chips and the local insulating layer which are provided on the carrier film. The method of the present invention according to the twenty-eighth aspect also corresponds to a manufacturing method of the light-emitting device having a so-called "reflector structure".

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

Figure 21:
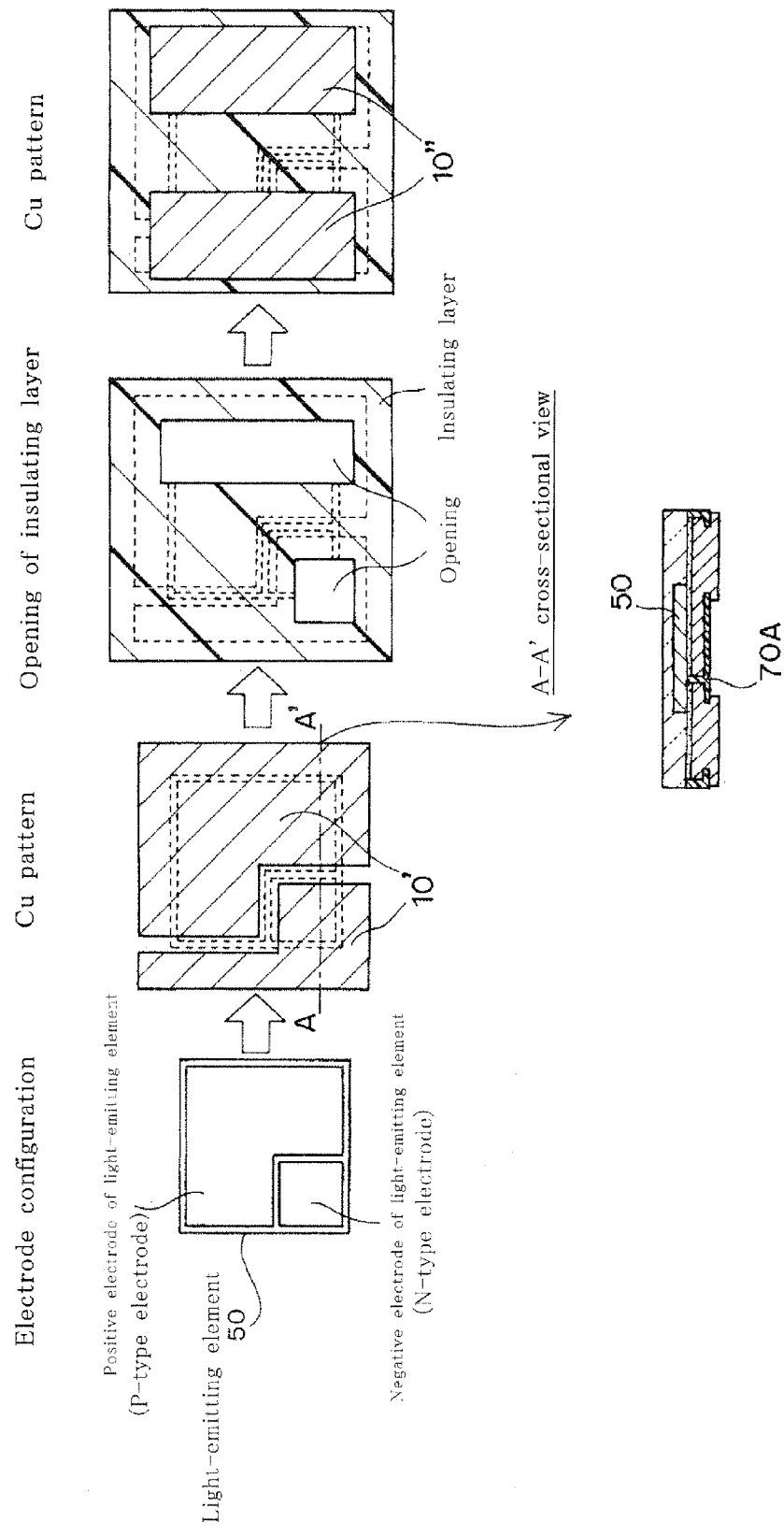
FIG. 21 includes schematic views for explaining a position of a local region 70A of a first insulating part (viewed from a bottom-sided principal surface of a light-emitting element).
Figure 22:
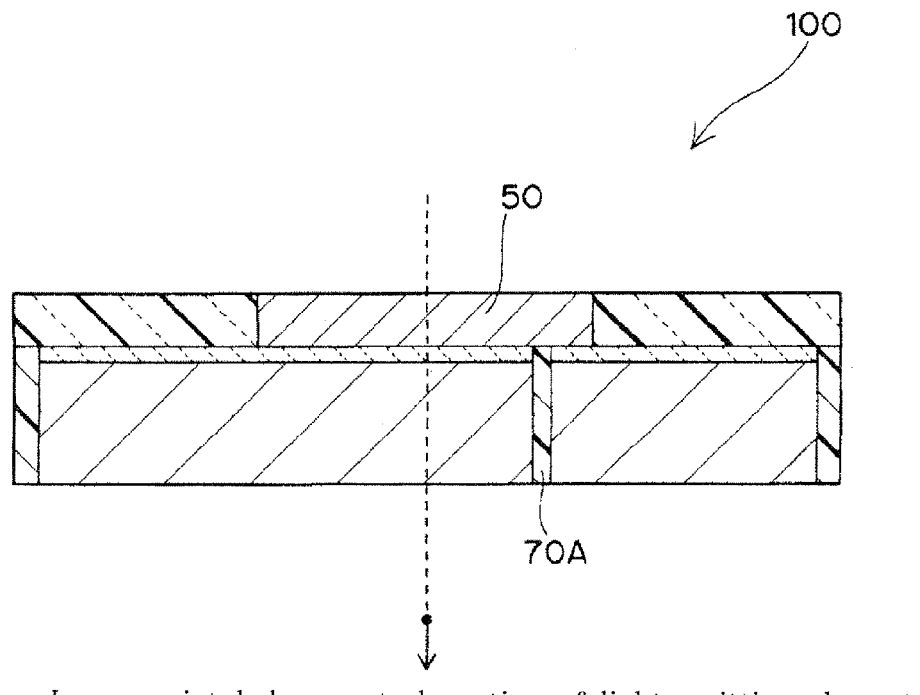
FIG. 22 is a schematic view for explaining a modified position of the local region 70A of the first insulating part.
Figure 23A:
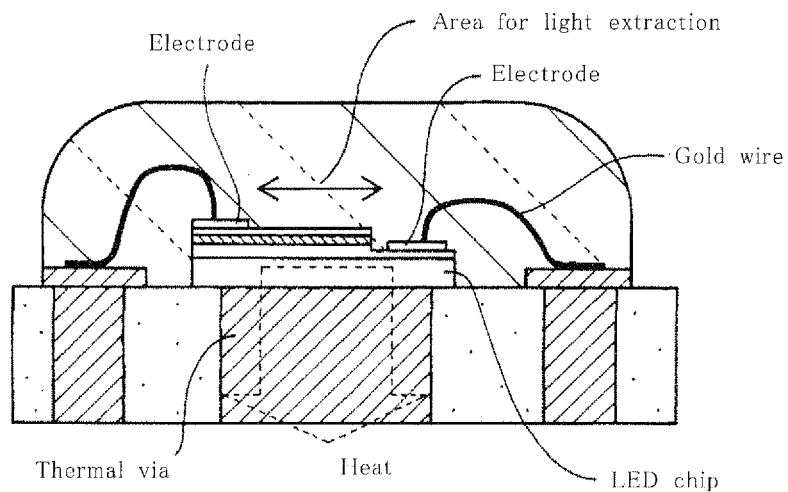
FIGS. 23A to 23B are schematic sectional views illustrating the configurations of a LED package according to the prior art.
Figure 23B:
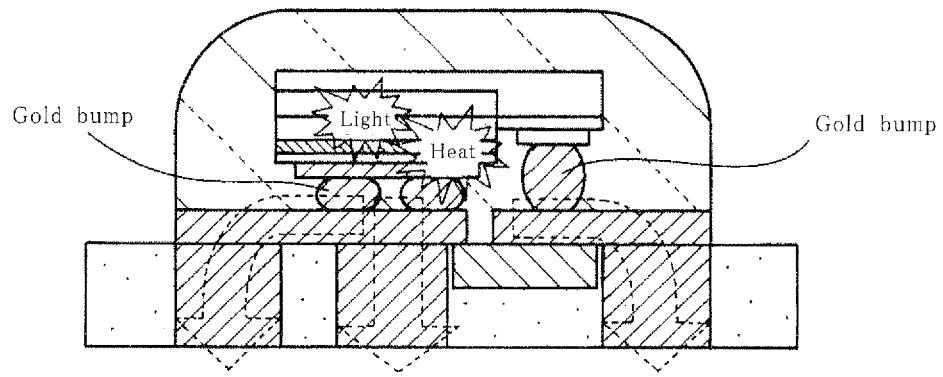

For example, in the above embodiments, the "local region 70A of the first insulating parts" provided between the positive electrode portion (i.e., electrode connected to the P-type electrode of the light-emitting element) and the negative electrode portion (i.e., electrode connected to the N-type electrode of the light-emitting element) of the light-emitting element electrode parts are positioned below the central portion of the light-emitting element (see FIG. 5, for example). However, the present invention is not limited to such embodiments. In view of an actual embodiment, the positive electrode may be generally larger than the negative electrode, as shown in FIG. 21. Therefore, as shown in the cross-sectional view (A-A' cross-sectional view) of FIG. 21 and the schematic cross-sectional view of FIG. 22, the local region 70A of the first insulating parts is positioned offset from below the central portion of the light-emitting element get.

INDUSTRIAL APPLICABILITY

The light-emitting device according to the present invention can be suitably used for various types of lighting applications as well as a wide range of applications such as backlight source applications for display device (LCD), camera flash applications, and automotive applications.

CROSS REFERENCE TO RELATED PATENT APPLICATION

The present application claims the right of priority of Japan patent application No. 2012-30739 (filing date: Feb. 15, 2012, title of the invention: LIGHT-EMITTING DEVICE AND METHOD FOR MANUFACTURING THE SAME), the whole contents of which are incorporated herein by reference.

EXPLANATION OF REFERENCE NUMERALS

10 Electrode part for light-emitting element
10' Sub-electrode pattern (first sub-electrode pattern)
10" Second sub-electrode pattern (second sub-electrode pattern)
10a Positive electrode (electrode connected to P-type electrode of light-emitting element)
10b Negative electrode (electrode connected to N-type electrode of light-emitting element)
30 Reflective layer
50 Light-emitting element
50' LED wafer
70 First insulating part
70A First insulating part locally provided between positive electrode portion and negative electrode portion
70A1 Narrower region of locally provided first insulating part
70A2 Wider region of locally provided first insulating part
70' Insulating layer pattern (resin layer pattern or inorganic material layer pattern, for example)
72 Second insulating part (insulating layer)
72' Sealing layer (sealing resin layer or sealing inorganic material layer, for example)
80 Phosphor layer
85 Carrier film
90 Lens part
100 Light-emitting device
100' Precursor of light-emitting device

The invention claimed is:
1. A light-emitting device comprising:
a light-emitting diode (LED) chip;
an electrode part for the LED chip; and
a reflective layer provided on the electrode part,
wherein the reflective layer and the electrode part have a bended form such that a central portion of the reflective layer and a central portion of the electrode part are raised,
wherein the LED chip is provided on the reflective layer such that the LED chip is in contact with the central portion of the reflective layer,
wherein the LED chip and the electrode part are in an electrical connection with each other by mutual surface contact via the central portion of the reflective layer, wherein the electrode part is thicker than the LED chip and has a thickness such that the electrode part serves as a supporting layer for supporting the LED chip, wherein the electrode part extends, in a lateral direction, toward an outside of the LED chip and beyond the LED chip, and wherein the electrode part is provided as a wet plating layer, and the reflective layer is provided as a dry plating layer.

2. The light-emitting device according to claim 1, further comprising a first insulating part provided around the electrode part and a second insulating part provided around the LED chip.

3. The light-emitting device according to claim 2, wherein the electrode part and the first insulating part serve as the supporting layer.

4. The light-emitting device according to claim 2, wherein the second insulating part serves as a sealing layer for sealing the LED chip.

5. The light-emitting device according to claim 2, wherein the second insulating part has a light permeability.

6. The light-emitting device according to claim 2, further comprising a phosphor layer provided on the second insulating part.

7. The light-emitting device according to claim 2, wherein the second insulating part comprises a phosphor component, and thereby the second insulating part serves as both of a sealing layer and a phosphor layer.

8. The light-emitting device according to claim 2,
wherein the electrode part comprises a positive electrode portion and a negative electrode portion, and
wherein the first insulating part is provided at least between the positive electrode portion and the negative electrode portion.

9. The light-emitting device according to claim 8, wherein a local region of the first insulating part comprises two portions of a narrower region and a wider region, the local region being located between the positive electrode portion and the negative electrode portion.

10. A method for manufacturing a light-emitting device comprising a light-emitting diode (LED) chip, the method comprising:
(i) providing the LED chip; and
(ii) forming an electrode part on the LED chip such that a central portion of the electrode part is raised, the electrode part being for the LED chip, wherein, in the step (ii), a foundation layer for the forming of the electrode part is formed on the LED chip such that a central portion of the foundation layer is raised, and thereafter the electrode part is formed such that the electrode part makes surface contact with the LED chip via the central portion of the foundation layer, wherein the foundation layer is eventually used as a reflective layer of the light-emitting device, wherein the foundation layer is formed by a dry plating process and the electrode part is formed by a wet plating process, wherein the electrode part is thicker than the LED chip and has a thickness such that the electrode part serves as a supporting layer for supporting the LED chip, and wherein, in the step (ii), the electrode part is formed such that the electrode part extends, in a lateral direction, toward an outside of the LED chip and beyond the LED chip.

11. The method according to claim 10, wherein, the LED chip provided in the step (i) has an insulating layer at least on a principal surface of the LED chip.

12. The method according to claim 11,
wherein, in the step (i), the LED chip is disposed on a carrier film, and the insulating layer is formed on the carrier film to cover the LED chip and thereafter the carrier film is removed, and thereby the LED chip buried in the insulating layer is provided, the buried chip being flush with the insulating layer.

13. The method according to claim 11,
wherein, in the step (i), the LED chip is disposed on a phosphor layer formed on a carrier film, and thereafter an insulating layer is formed on the phosphor layer to cover the LED chip, and
wherein the carrier film is eventually not removed but used as a lens part of the light-emitting device.

14. The method according to claim 10, further comprising forming an insulating part around the electrode part,
wherein the forming of the electrode part includes two phases to form a first sub-electrode part and to form a second sub-electrode part, and the forming of the insulating part is performed at a point in time between the forming of the first sub-electrode part and the forming of the second sub-electrode part.

* * * * *